(12) United States Patent
Chenevert et al.

(10) Patent No.: US 9,851,426 B2
(45) Date of Patent: Dec. 26, 2017

(54) ERROR ANALYSIS AND CORRECTION OF MRI ADC MEASUREMENTS FOR GRADIENT NONLINEARITY

(71) Applicant: THE REGENTS OF THE UNIVERSITY OF MICHIGAN, Ann Arbor, MI (US)

(72) Inventors: Thomas L. Chenevert, Ann Arbor, MI (US); Brian D. Ross, Ann Arbor, MI (US); Dariya I. Malyarenko, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 552 days.

(21) Appl. No.: 14/398,533

(22) PCT Filed: May 3, 2013

(86) PCT No.: PCT/US2013/039511
§ 371 (c)(1),
(2) Date: Nov. 3, 2014

(87) PCT Pub. No.: WO2013/166416
PCT Pub. Date: Nov. 7, 2013

(65) Prior Publication Data
US 2015/0137813 A1    May 21, 2015

Related U.S. Application Data

(60) Provisional application No. 61/703,600, filed on Sep. 20, 2012, provisional application No. 61/643,040, filed on May 4, 2012.

(51) Int. Cl.
*G01V 3/00* (2006.01)
*G01R 33/563* (2006.01)
(Continued)

(52) U.S. Cl.
CPC ....... *G01R 33/56341* (2013.01); *G01R 33/28* (2013.01); *G01R 33/5602* (2013.01); *G01R 33/56572* (2013.01)

(58) Field of Classification Search
USPC ........................................ 324/322
See application file for complete search history.

(56) References Cited

U.S. PATENT DOCUMENTS 6,163,152 A    12/2000   Bernstein et al.
6,381,296 B1    4/2002   Nishiura
(Continued)

FOREIGN PATENT DOCUMENTS

WO    WO-01/56466 A2    8/2001
WO    WO-02/061457 A2    8/2002
(Continued)

OTHER PUBLICATIONS

International preliminary report on patentability from PCT/US2013/039511 dated Nov. 13, 2014.
(Continued)

*Primary Examiner* — Rodney Fuller
(74) *Attorney, Agent, or Firm* — Marshall, Gerstein & Borun LLP

(57) ABSTRACT

Techniques for correcting gradient non-linearity bias in mean diffusivity measurements by MRI systems are shown and include minimal number of spatial correction terms to achieve sufficient error control using three orthogonal diffusion weighted imaging (DWI) gradients. The correction is based on rotation of system gradient nonlinearity tensor into a DWI gradient frame where spatial bias of b-matrix is described by its Euclidian norm. The techniques obviate time consuming multi-direction acquisition and noise-sensitive mathematical diagonalization of a full diffusion tensor for medium of arbitrary anisotropy.

30 Claims, 8 Drawing Sheets

(51) Int. Cl.
G01R 33/565 (2006.01)
G01R 33/28 (2006.01)
G01R 33/56 (2006.01)

(56) References Cited

U.S. PATENT DOCUMENTS

| | | | |
|---|---|---|---|
| 6,567,684 | B1 | 5/2003 | Chenevert et al. |
| 6,579,240 | B2 | 6/2003 | Bjaerum et al. |
| 6,845,342 | B1 | 1/2005 | Basser et al. |
| 6,901,277 | B2 | 5/2005 | Kaufman et al. |
| 6,969,991 | B2 | 11/2005 | Bammer et al. |
| 7,078,897 | B2 | 7/2006 | Yablonskiy et al. |
| 7,897,792 | B2 | 3/2011 | Iikura et al. |
| 7,949,164 | B2 | 5/2011 | Degani et al. |
| 8,185,186 | B2 | 5/2012 | Ross et al. |
| 2003/0018245 | A1 | 1/2003 | Kaufman et al. |
| 2003/0065260 | A1 | 4/2003 | Cheng et al. |
| 2004/0254444 | A1 | 12/2004 | Bittner |
| 2005/0105788 | A1 | 5/2005 | Turek et al. |
| 2008/0021301 | A1 | 1/2008 | Gonzalez et al. |
| 2009/0035218 | A1 | 2/2009 | Ross et al. |
| 2009/0234237 | A1 | 2/2009 | Ross et al. |
| 2009/0058417 | A1 | 3/2009 | Yanasak et al. |
| 2010/0088339 | A1 | 4/2010 | Rietzel et al. |
| 2010/0249099 | A1 | 9/2010 | Rewcastle et al. |
| 2010/0254584 | A1 | 10/2010 | Gulsun et al. |
| 2011/0009405 | A1 | 1/2011 | Rewcastle et al. |
| 2011/0053907 | A1 | 3/2011 | Rewcastle et al. |
| 2011/0066024 | A1 | 3/2011 | Shih et al. |
| 2011/0077503 | A1 | 3/2011 | Bonilha et al. |
| 2011/0187367 | A1* | 8/2011 | Feiweier ............... G01R 33/44 324/309 |
| 2012/0316422 | A1 | 12/2012 | Ross et al. |
| 2013/0004043 | A1 | 1/2013 | Ross et al. |
| 2013/0004044 | A1 | 1/2013 | Ross et al. |
| 2013/0129168 | A1 | 5/2013 | Ross |
| 2017/0120041 | A1* | 5/2017 | Wenger ............... A61N 1/0456 |

FOREIGN PATENT DOCUMENTS

| | | |
|---|---|---|
| WO | WO-2008/122056 A2 | 10/2008 |
| WO | WO-2008/154741 A1 | 12/2008 |
| WO | WO-2010/116124 A1 | 10/2010 |
| WO | WO-2011/137370 A2 | 11/2011 |
| WO | WO-2013/003826 A1 | 1/2013 |
| WO | WO-2013/006506 A1 | 1/2013 |
| WO | WO-2013/078370 A1 | 5/2013 |
| WO | WO-2013/166416 A1 | 11/2013 |

OTHER PUBLICATIONS

Bagrodia et al., Mechanisms of intrinsic and acquired resistance to kinase-targeted therapies, Pigment Cell Melanoma Res., 25(6):819-31 (2012).
Baines et al., Inhibition of Ras for cancer treatment: the search continues, Future Med. Chem., 3(14):1787-808 (2011).
Bammer et al., Analysis and generalized correction of the effect of spatial gradient field distortions in diffusion weighted imaging, Magn. Res. Med, 50:560-9 (2003).
Bammer et al., Assessment of spatial gradient field distortion in diffusion-weighted imaging, ISMRM Proceedings (2002).
Besil et al., A method for registration of 3-D shapes, IEEE Trans. Pattern Analysis and Machine Intelligence, 14(2):239-56 (1992).
Bing et al., Voxel-by-voxel functional diffusion mapping for early evaluation of breast cancer treatment, Information Processing in Medical Imaging, pp. 276-287 (2009).
Bookstein et al., Principal Warps: Thin-plate splines and the decomposition of deformations, IEEE Transactions on Pattern Analysis and Machine Intelligence, 11(6):567-85 (1989).
Breen et al., Three-dimensional method for comparing in vivo interventional MR images of thermally ablated tissue with tissue response, J. Magn. Reson. Imaging, 18(1):90-102 (2003).
Brix et al., Microcirculation and microvasculature in breast tumors: pharmacokinetics analysis of dynamic MR image series, Mag. Reson. Med., 52:420-9 (2004).
Brix et al., Pharmacokinetic parameters in CNS Gd-DTPA enhanced MR imaging, J. Comput Assist. Tomogr., 15:621-8 (1991).
Bubley et al., Eligibility and response guidelines for phase II clinical trials in androgen-independent prostate cancer: recommendations from the Prostate-Specific Antigen Working Group, J. Clin. Oncol., 17(11):3461-7 (1999).
Bulinski et al., Overexpression of MAP4 inhibits organelle motility and trafficking in vivo, J. Cell Sci., 110(Pt. 4):3055-64 (1997).
Cao et al., Survival prediction in high-grade gliomas by MRI perfusion before and during early stage of RT, Int. J. Radiat. Oncol. Biol. Phys., 64:876-85 (2006).
Carracedo et al., Inhibition of mTORC1 leads to MAPK pathway activation through a PI3K-dependent feedback loop in human cancer, J. Clin Invest., 118(9):3065-74 (2008).
Castellano et al., RAS Interaction with PI3K: More Than Just Another Effector Pathway, Genes Cancer, 2(3):261-74 (2011).
Chan et al., Survival and failure patterns of high-grade gliomas after three-dimensional conformal radiotherapy, J. Clin. Oncol., 20:1635-42 (2002).
Chenevert et al., Diffusion coefficient measurement using a temperature-controlled fluid for quality control in multicenter studies, J. Magn. Reson. Imaging, 34(4):983-7 (2011).
Chenevert et al., Diffusion magnetic resonance imaging: an early surrogate marker of therapeutic efficacy in brain tumors, J. Natl. Cancer Inst., 92(24):2029-36 (2000).
Chenevert et al., Diffusion MRI: a new strategy for assessment of cancer therapeutic efficacy, Mol. Imaging, 1(4):336-43 (2002).
Chenevert et al., Icewater for quality control of diffusion measurements in multi-center trials, in Proceedings of the 19th Annual Meeting of ISMRM, Montreal, Quebec, Canada, p. 912 (2011).
Chenevert et al., Monitoring early response of experimental brain tumors to therapy using diffusion magnetic resonance imaging, Clin. Cancer Res., 3(9):1457-66 (1997).
Collignon et al., 3D multi-modality medical image registration using feature space clustering, Lecture Notes in Computer Science, 905:195-204 (1995).
Degani, Mapping pathophysiological features of breast tumors by MRI at high spatial resolution, Nat. Med., 3:780-2 (1997).
Dhermain et al., Advanced MRI and PET imaging for assessment of treatment response in patients with gliomas, The Lancet Neurology, 9(9):906-20 (2010).
Early Breast Cancer Trialists Collaborative Group, Polychemotherapy for early breast cancer: an overview of the randomised trials, The Lancet, 352:930-42 (1998).
Eda et al., The relations between expiratory chest CT using helical CT and pulmonary function tests in emphysema, Am. J. Respir. Crit Care Med., 155(4):1290-4 (1997).
Ellingson et al., Volumetric analysis of functional diffusion maps is a predictive imaging biomarker for cytotoxic and anti-angiogenic treatments in malignant gliomas, J. Neuro-Oncol., 102(1):95-103 (2010).
Engelman et al., Effective use of PI3K and MEK inhibitors to treat mutant Kras G12D and PIK3CA H1047R murine lung cancers, Nat. Med., 14(12):1351-6 (2008).
Evelhoch et al., Applications of magnetic resonance in model systems: cancer therapeutics, Neoplasia, 2(1-2):152-65 (2000).
Eyal et al., Model-based and model-free parametric analysis of breast dynamic-contrast-enhanced MRI, NMR Biomed., 22:40-53 (2007).
Falchook et al., Activity of the oral MEK inhibitor trametinib in patients with advanced melanoma: a phase 1 dose-escalation trial, Lancet Oncol., 13(8):782-9 (2012).
Fogelman et al., Positron emission tomography and bone metastases, Semin. Nucl. Med., 35(2):135-42 (2005).
Galban et al., A feasibility study of parametric response map analysis of diffusion-weighted magnetic resonance imaging scans of head and neck cancer patients for providing early detection of therapeutic efficacy, Translational Oncol., 2:184-90 (2009).
Galban et al., Prospective analysis of parametric response map-derived MRI biomarkers: identification of early and distinct glioma

(56) References Cited

OTHER PUBLICATIONS response patterns not predicted by standard radiographic assessment, Clin. Cancer Res., 17(14):4751-60 (2011).
Galban et al., The parametric response map is an imaging biomarker for early cancer treatment outcome, Nature Medicine, 15(5):572-6 (2009).
Galbraith et al., Reproducibility of dynamic contrast-enhanced MRI in human muscle and tumours: comparison of quantitative and semi-quantitative analysis, NMR Biomed., 15:132-42 (2002).
Galons et al., Early increases in breast tumor xenograft water mobility in response to paclitaxel therapy detected by non-invasive diffusion magnetic resonance imaging, Neoplasia, 1(2):113-7 (1999).
Gevenois et al., Comparison of computed density and macroscopic morphometry in pulmonary emphysema, Am. J. Respir. Crit. Care Med., 152(2):653-7 (1995).
Gevenois et al., Comparison of computed density and microscopic morphometry in pulmonary emphysema, Am. J. Respir. Crit. Care Med., 154(1):187-92 (1996).
Gorbunova et al., Early detection of emphysema progression, Med. Image Comput. Comput. Assist. Interv., 13(Pt. 2)1 93-200 (2010).
Gorbunova et al., Weight preserving image registration for monitoring disease progression in lung CT, Medical Image Computing and Computer-Assisted Intervention A MICCAI 2008, pp. 863-870 (2008).
Green et al., Multi-scale rigid registration to detect damage in micro-CT images of progressively loaded bones, 2011 8th IEEE International Symposium on Biomedical Imaging: From Nano to Micro, IEEE, pp. 1231-1234 (2011).
Hall et al., Therapeutic efficacy of DTI-015 using diffusion magnetic resonance imaging as an early surrogate marker, Clin. Cancer Res., 10(23):7852-9 (2004).
Hamaoka et al., Bone imaging in metastatic breast cancer, J. Clin. Oncol., 22(14):2942-53 (2004).
Hamstra et al., Evaluation of the functional diffusion map as an early biomarker of time-to-progression and overall survival in high-grade glioma, Proc. Natl. Acad. Sci. USA, 102(46):16759-64 (2005).
Hamstra et al., Functional diffusion map as an early imaging biomarker for high-grade glioma: correlation with conventional radiologic response and overall survival, J. Clin. Oncol., 26(20):3387-94 (2008).
Hamstra et al., The use of 19F spectroscopy and diffusion-weighted MRI to evaluate differences in gene-dependent enzyme prodrug therapies, Mol. Ther., 10(5):916-28 (2004).
Hatzivassiliou et al., RAF inhibitors prime wild-type RAF to activate the MAPK pathway and enhance growth, Nature, 464(7287):431-5 (2010).
Hayward et al., Assessment of response to therapy in advanced breast cancer (an amendment), Br. J. Cancer, 38(1):201 (1978).
Hayward et al., Assessment of response to therapy in advanced breast cancer, Br. J. Cancer, 35(3):292-8 (1977).
Helen et al., Segmentation of pulmonary parenchyma in CT lung images based on 2D Otsu optimized by PSO, Emerging Trends in Electrical and Computer Technology, 2011 International Conference on IEEE, pp. 536-541 (2011).
Hoffmann, Pharmacokinetic mapping of the breast: a new method for dynamic MR mammography, Magn. Reson. Med., 33:506-14 (1995).
Hogg et al., The nature of small-airway obstruction in chronic obstructive pulmonary disease, N. Engl. J. Med., 350(26):2645-53 (2004).
Hu et al., Automatic lung segmentation for accurate quantitation of volumetric X-ray CT images, IEEE Trans. Med. Imaging, 20(6):490-8 (2001).
Hylton, Dynamic contrast-enhanced magnetic resonance imaging as an imaging biomarker, J. Clin. Oncol., 24:3293-8 (2006).
Infante et al., Safety, pharmacokinetic, pharmacodynamic, and efficacy data for the oral MEK inhibitor trametinib: a phase 1 dose-escalation trial, Lancet Oncol., 13(8):773-81 (2012).
International Search Report and Written Opinion, International Application No. PCT/US13/39511, dated Sep. 4, 2013.
Jacobs et al., Registration and warping of magnetic resonance images to histological sections, Med. Phys., 26(8):1568-78 (1999).
Janke et al., Use of spherical harmonic deconvolution methods to compensate for nonlinear gradient effects on MRI images, Magn. Reson. Med., 52(1):115-22 (2004).
Jemal et al., Cancer statistics, 2010, CA Cancer J. Clin., 60(5):277-300 (2010).
Jennings et al., Early response of prostate carcinoma xenografts to docetaxel chemotherapy monitored with diffusion MRI, Neoplasia, 4(3):255-62 (2002).
Jordan et al., Dynamic contrast-enhanced and diffusion MRI show rapid and dramatic changes in tumor microenvironment in response to inhibition of HIF-1alpha using PX-478, Neoplasia, 7(5):475-85 (2005).
Kalikin et al., In vivo visualization of metastatic prostate cancer and quantitation of disease progression in immunocompromised mice, Cancer Biol. Ther., 2(6):656-60 (2003).
Karreth et al., C-Raf inhibits MAPK activation and transformation by B-Raf(V600E), Mol. Cell, 36(3):477-86 (2009).
Kiessling et al., Contrast agents and applications to assess tumor angiogenesis in vivo by magnetic resonance imaging, Curr. Med. Chem., 14:77-91 (2007).
Kim et al., Correction of local deformations in fMRI by 3D non-linear warping in map-slice-to-volume approach, Proc. Intl. Soc. Mag. Reson. Med., 8:1765 (2000).
Kim et al., CT metrics of airway disease and emphysema in severe COPD, Chest., 136(2):396-404 (2009).
Kim et al., Mutual information for automated unwarping of rat brain autoradiographs, Neuroimage, 5(1):31-40 (1997).
Kim et al., Phase II study of the MEK1/MEK2 inhibitor Trametinib in patients with metastatic BRAF-mutant cutaneous melanoma previously treated with or without a BRAF inhibitor, J. Clin. Oncol., 31(4):482-9 (2013).
Kubo et al., Expiratory and inspiratory chest computed tomography and pulmonary function tests in cigarette smokers, Eur. Respir. J., 13(2):252-6 (1999).
Latour et al., Time-dependent diffusion of water in a biological model system, Proc. Natl. Acad. Sci. USA, 91(4):1229-33 (1994).
Laun et al., How background noise shifts eigenvectors and increases eigenvalues in DTI, MAGMA, 22(3):151-8 (2009).
Lazebnik et al., Volume registration using needle paths and point landmarks for evaluation of interventional MRI treatments, IEEE Trans. Med. Imaging, 22(5):653-60 (2003).
Lee et al., A feasibility study evaluating the functional diffusion map as a predictive imaging biomarker for detection of treatment response in a patient with metastic prostate cancer to the bone, Neoplasia, 9(12):1003-11 (2007).
Lee et al., Dynamic imaging of emerging resistance during cancer therapy, Cancer Res., 66(9):4687-92 (2006).
Lee et al., Prospective early response imaging biomarker for neoadjuvant breast cancer chemotherapy, Clin. Cancer Res., 13(2 Pt. 1):443-50 (2007).
Leung et al., Automatic quantification of changes in bone in serial MR images of joints, IEEE Transactions on Medical Imaging, 25(12):1617-26 (2006).
Li et al., Pulmonary CT image registration and warping for tracking tissue deformation during the respiratory cycle through 3D consistent image registration, Med. Phys., 35(12):5575-83 (2008).
Lorusso et al., Phase I and pharmacodynamic study of the oral MEK inhibitor CI-1040 in patients with advanced malignancies, J. Clin. Oncol., 23(23):5281-93 (2005).
Low et al., Novel breathing motion model for radiotherapy, Int. J. Radiat. Oncol. Biol. Phys., 63(3):921-9 (2005).
Lyng et al., Measurement of cell density and necrotic fraction in human melanoma xenografts by diffusion weighted magnetic resonance imaging, Magn. Reson. Med., 43(6):828-36 (2000).
Ma et al., Asymmetric dipolar cycloaddition reactions: a practical, convergent synthesis of chiral pyrrolidines,Tetrahedron: asymmetry, 8(6):883-8 (1997).

(56) References Cited

OTHER PUBLICATIONS

Ma et al., Voxel-by-voxel functional diffusion mapping for early evaluation of breast cancer treatment, Inf. Process. Med. Imaging, 21:276-87 (2009).
Macdonald et al., Response criteria for phase II studies of supratentorial malignant glioma, J. Clin. Oncol., 8(7):1277-80 (1990).
Magnetic Resonance Imaging, two pages, Churchill Livingstone's Dictionary of Nursing (2006).
Matsuoka et al., Quantitative assessment of air trapping in chronic obstructive pulmonary disease using inspiratory and expiratory volumetric MDCT, AJR Am. J. Roentgenol., 190(3):762-9 (2008).
Matsuoka et al., Quantitative assessment of peripheral airway obstruction on paired expiratory/inspiratory thin-section computed tomography in chronic obstructive pulmonary disease with emphysema, J. Comput. Assist. Tomogr., 31(3):384-9 (2007).
Mattiello et al., The b matrix in diffusion tensor echo-planar imaging, Magn. Reson. Med., 37(2):292-300 (1997).
McCubrey et al., Emerging Raf inhibitors, Expert Opin. Emerg. Drugs, 14(4):633-48 (2009).
Mehta et al., Monitoring radiographic brain tumor progression, Toxins (Basel), 3(3):191-200 (2011).
Meyer et al., A methodology for registration of a histological slide and in vivo MRI volume based on optimizing mutual information, Mol. Imaging, 5(1):16-23 (2006).
Meyer et al., Demonstration of accuracy and clinical versatility of mutual information for automatic multimodality image fusion using affine and thin-plate spline warped geometric deformations, Med. Image Anal., 1(3):195-206 (1997).
Mirzoeva et al., Basal subtype and MAPK/ERK kinase (MEK)-phosphoinositide 3-kinase feedback signaling determine susceptibility of breast cancer cells to MEK inhibition, Cancer Res., 69(2):565-72 (2009).
Moffat et al., Diffusion imaging for evaluation of tumor therapies in preclinical animal models, MAGMA, 17(3-6):249-59 (2004).
Moffat et al., Diffusion MR imaging in adult neoplasia, CUP, Cambridge: Physiological MR in Clinical Neuroscience, (2004).
Moffat et al., Functional diffusion map: a noninvasive MRI biomarker for early stratification of clinical brain tumor response, Proc. Natl. Acad. Sci. USA, 102(15):5524-9 (2005).
Moffat et al., The functional diffusion map: an imaging biomarker for the early prediction of cancer treatment outcome, Neoplasia, 8(4):259-67 (2006).
Montagut et al., Targeting the RAF-MEK-ERK pathway in cancer therapy, Cancer Lett., 283(2):125-34 (2009).
Muhlradt et al., Epothilone B stabilizes microtubuli of macrophages like taxol without showing taxol-like endotoxin activity, Cancer Res., 57(16):3344-6 (1997).
Nakano et al., Computed tomographic measurements of airway dimensions and emphysema in smokers. Correlation with lung function, Am. J. Respir. Crit. Care Med., 162(3 Pt. 1):1102-8 (2000).
Nicolaou et al., Synthesis of epothilones A and B in solid and solution phase, Nature, 387(6630):268-72 (1997).
O'Connor et al., DCE-MRI biomarkers in the clinical evaluation of antiangiogenic and vascular disrupting agents, Br. J. Cancer, 96:189-95 (2007).
Ostergard et al., High resolution measurement of cerebral blood flow using intravascular tracer bolus passages, Part I: Mathematical approach and statistical analysis, Magn. Reson. Med., 36:715-25 (1996).
Ozcan et al., Characterization of imaging gradients in diffusion tensor imaging, J. Magn. Reson., 207(1):24-33 (2010).
Padhani et al., Diffusion-weighted magnetic resonance imaging as a cancer biomarker: consensus and recommendations, Neoplasia, 11(2):102-25 (2009).
Panda et al., Differential effects of vinblastine on polymerization and dynamics at opposite microtubule ends, J. Biol. Chem., 271(47):29807-12 (1996).
Panda et al., Stabilization of microtubule dynamics by estramustine by binding to a novel site in tubulin: a possible mechanistic basis for its antitumor action, Proc. Natl. Acad. Sci. USA, 94(20):10560-4 (1997).
Park et al., Registration methodology for histological sections and ex vivo imaging of human prostate, Academic Radiology, 15(8) (Aug. 2008).
Pelizzari et al., Three dimensional correlation of PET, CT and MRI images, J. Nucl. Med., 28(4):682-3 (1987).
Petrylak et al., Docetaxel and estramustine compared with mitoxantrone and prednisone for advanced refractory prostate cancer, N. Engl. J. Med., 351(15)1513-20 (2004).
Poulikakos et al., RAF inhibitors transactivate RAF dimers and ERK signalling in cells with wild-type BRAF, Nature, 464(7287):427-30 (2010).
Preusser et al., Current concepts and management of glioblastoma, Ann. Neurol., 70(1):9-21 (2011).
Regan et al., Genetic epidemiology of COPD (COPDGene) study design, COPD, 7(1):32-43 (2010).
Rehemtulla et al., Molecular imaging of gene expression and efficacy following adenoviral-mediated brain tumor gene therapy, Mol. Imaging, 1(1):43-55 (2002).
Reinhardt et al., Registration-based estimates of local lung tissue expansion compared to xenon CT measures of specific ventilation, Med. Image Anal., 12(6):752-63 (2008).
Reinhardt et al., Registration-derived estimates of local lung expansion as surrogates for regional ventilation, Int. Process. Med. Imaging, 20:763-74 (2007).
Reischauer et al., Bone metastases from prostate cancer: assessing treatment response by using diffusion-weighted imaging and functional diffusion maps—initial observations, Radiology, 257(2):523-31 (2010).
Robson, Non-linear gradients on clinical MRI systems introduce systematic errors in ADC and DTI measurements, ISMRM Proceedings (2002).
Rodrigues et al., The C-neu mammary carcinoma in Oncomice; characterization and monitoring response to treatment with herceptin by magnetic resonance methods, MAGMA, 17(3-6):260-70 (2004).
Romeo et al., Magnet field profiling: analysis and correcting coil design, Magn. Reson. Med., 1(1):44-65 (1984).
Rosen et al., Perfusion imaging with NMR contrast agents, Magn. Reson. Med., 14:249-65 (1990).
Ross et al. Assessment of the functional diffusion map: an imaging biomarker for early stratification of glioma clinical response, 2006 ASCO Annual Meeting Journal of Clinical Oncology, 24(18s): 1518 (2006).
Ross et al., Contributions of cell kill and posttreatment tumor growth rates to the repopulation of intracerebral 9L tumors after chemotherapy: an MRI study, Proc. Natl. Acad. Sci. USA, 95(12):7012-7 (1998).
Ross et al., Evaluation of cancer therapy using diffusion magnetic resonance imaging, Mol. Cancer Ther., 2(6):581-7 (2003).
Ross et al., Magnetic resonance imaging in cancer research, Eur. J. Cancer, 38(16):2147-56 (2002).
Ross et al., The role of magnetic resonance in the evaluation of cancer therapeutics, Clin. Cancer Res., 5:3870s-1s (1999).
Roth et al., High-b-value diffusion-weighted MR imaging for pretreatment prediction and early monitoring of tumor response to therapy in mice, Radiology, 232(3):685-92 (2004).
Sawllani et al., Glioblastoma: a method for predicting response to antiangiogenic chemotherapy by using MR perfusion imaging-pilot study, Radiology, 255(2):622 (2010).
Sawyers, Imatinib GIST keeps finding new indications: successful treatment of dermatofibrosarcoma protuberans by targeted inhibition of the platelet-derived growth factor receptor, J. Clin. Oncol., 20(17):3568-9 (2002).
Schepkin et al., Proton and sodium MRI assessment of emerging tumor chemotherapeutic resistance, NMR Biomed., 19(8):1035-42 (2006).
Scher et al., Prostate cancer clinical trial end points: "RECIST"ing a step backwards, Clin. Cancer Res., 11(14):5223-32 (2005).

(56) References Cited

OTHER PUBLICATIONS

Scher et al., The association between measures of progression and survival in castrate-metastatic prostate cancer, Clin. Cancer Res., 13(5):1488-92 (2007).
Sebolt-Leopold et al., Targeting the mitogen-activated protein kinase cascade to treat cancer, Nat. Rev. Cancer, 4(12):937-47 (2004).
Sebolt-Leopold, Advances in the development of cancer therapeutics directed against the RAS-mitogen-activated protein kinase pathway, Clin. Cancer Res., 14(12):3651-6 (2008).
Shimizu et al., The clinical effect of the dual-targeting strategy involving PI3K/AKT/mTOR and RAS/MEK/ERK pathways in patients with advanced cancer, Clin. Cancer Res., 18(8):2316-25 (2012).
Sos et al., Identifying genotype-dependent efficacy of single and combined PI3K- and MAPK-pathway inhibition in cancer, Proc. Natl. Acad. Sci. USA, 106(43):18351-6 (2009).
Stegman et al., Diffusion MRI detects early events in the response of a glioma model to the yeast cytosine deaminase gene therapy strategy, Gene Ther., 7(12):1005-10 (2000).
Taichman et al., The evolving biology and treatment of prostate cancer, J. Clin. Invest., 117)9):2351-61 (2007).
Tannock et al., Docetaxel plus prednisone or mitoxantrone plus prednisone for advanced prostate cancer, N. Engl. J. Med., 351(15):1502-12 (2004).
Therasse et al., New guidelines to evaluate the response to treatment in solid tumors. European Organization for Research and Treatment of Cancer, National Cancer Institute of the United States, National Cancer Institute of Canada, J. Natl. Cancer Inst., 92(3):205-16 (2000).
Thomas et al., Phase I study of the safety, tolerability, pharmacokinetics and pharmacodynamics of PTK787/ZK 222584 administered twice daily in patients with advanced cancer, J. Clin. Oncol., 23:4162-71 (2005).
Tofts et al., Estimating kinetic parameters from dynamic contrast-enhanced T(1)-weighted MRI of a diffusable tracer: standardized quantities and symbols, J. Magn. Reson. Imaging, 10:223-32 (1999).
Tofts, Modeling tracer kinetics in dynamic Gd-DTPA MR imaging, J. Magn. Reson. Imaging, 7:91-101 (1997).
Tsien et al., Parametric response map as an imaging biomarker to distinguish progression from pseudoprogression in high-grade glioma, J. Clin. Oncol., 28(13):2293-9 (2010).
Vasquez et al., Nanomolar concentrations of nocodazole alter microtubule dynamic instability in vivo and in vitro, Mol. Biol. Cell, 8(6):973-85 (1997).
Vilanova et al., Diffusion-weighted whole-body MR screening, Eur. J. Radiology, 67(3):440-7 (2008).
Viola et al., Alignment by maximization of mutual information, in Proceedings of 5th Intl. Conf. on Computer Vision, MIT, IEEE Press 95CH35744:16-23 (1995).
Washko et al., Identification of early interstitial lung disease in smokers from the COPDGene Study, Acad. Radiol., 17(1):48-53 (2010).
Washko et al., Lung volumes and emphysema in smokers with interstitial lung abnormalities, N. Engl. J. Med., 364(10:897-906 (2011).
Watts et al., "Relationship Between Changes in BMD and Nonvertebral Fracture Incidence Associated with Risedronate: Reduction in risk of Nonvertebral Fracture is not Related to Change in BMD," J Bone Miner Res. 20:2097-104 (2005).
Wee et al., PI3K pathway activation mediates resistance to MEK inhibitors in KRAS mutant cancers, Cancer Res., 69(10):4286-93 (2009).
Wen et al., Updated response assessment criteria for high-grade gliomas: response assessment in neuro-oncology working group, J. Clin. Oncol., 28(11):1963-72 (2010).
Wilson et al., Radiofrequency thermal ablation: 3D MR histology correlation for localization of cell death in MR lesion images, in: Proceedings of Intl. Symp. Biomed. Imaging, pp. 1537-1540 (2004).
World Health Organization, WHO Handbook for Reporting Results of Cancer Treatment, World Health Organization Offset Publication, Atlanta (1979).
Wu et al., A method for calibrating diffusion gradients in diffusion tensor imaging, J. Comput. Assist. Tomogr., 31(6):984-93 (2007).
Xiong et al., A phase I surrogate endpoint study of SU68868 in patients with solid tumors, Invest. New Drugs, 22:459-66 (2004).
Yamashiro et al., Collapsibility of lung volume by paired inspiratory and expiratory CT scans: correlations with lung function and mean lung density, Acad. Radiol., 17(4):489-95 (2010).
Yim et al., Deformable lung registration between exhale and inhale CT scans using active cells in a combined gradient force approach, Med. Phys., 37(8):4307-17 (2010).
Yin et al., Mass preserving nonrigid registration of CT lung images using cubic B-spline, Med. Phys., 36(9):4213-22 (2009).
Yu et al., Response and determinants of cancer cell susceptibility to PI3K inhibitors: combined targeting of PI3K and Mek1 as an effective anticancer strategy, Cancer Biol. Ther., 7(2):307-15 (2008).
Zahra et al., Dynamic contrast-enhanced MRI as a predictor of tumour response to radiotherapy, Lancet Oncol., 8:63-74 (2007).
Zarow et al., A standardized method for brain-cutting suitable for both stereology and MRI-brain co-registration, J. Neurosci. Methods, 139(2):209-15 (2004).
Zhao et al., Early detection of treatment response by diffusion-weighted 1 H-NMR spectroscopy in a murine tumour in vivo, Br. J. Cancer, 73(1):61-4 (1996).
Riches et al., Diffusion-weighted imaging of the prostate and rectal wall: comparison of biexponential and monoexponential modelled diffusion and associated perfusion coefficients, NMR Biomed., 22(3):318-25 (2009).
Lemke et al., Toward an optimal distribution of b values for intravoxel incoherent motion imaging, Magn. Reson. Imaging, 29(6):766-76 (2011).
Zacharaki et al., Orbit: A multiresolution framework for deformable registration of brain tumor images, IEEE Trans. Med. Imaging, 27(8):1003-17 (2008).
Tan et al., Improved Correction for Gradient Nonlinearity Effects in Diffusion-Weighted Imaging, Journal of Magnetic Resonance Imaging, 38:448-453 (2013).

\* cited by examiner

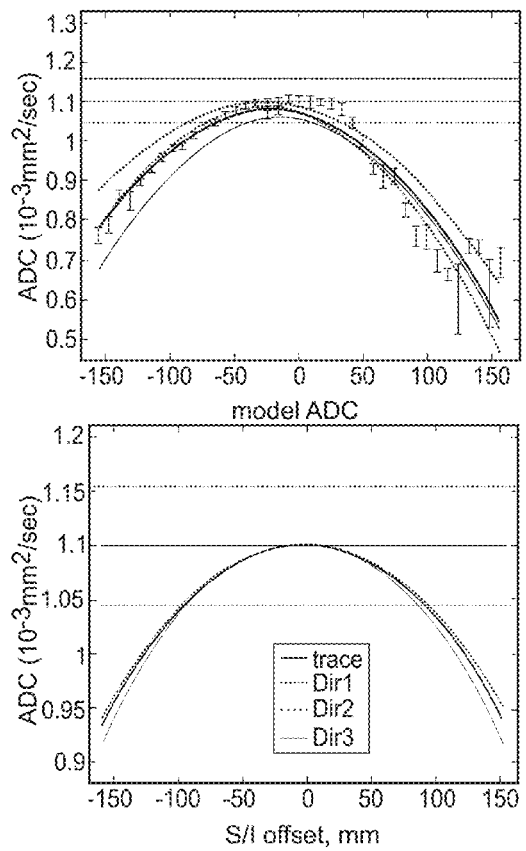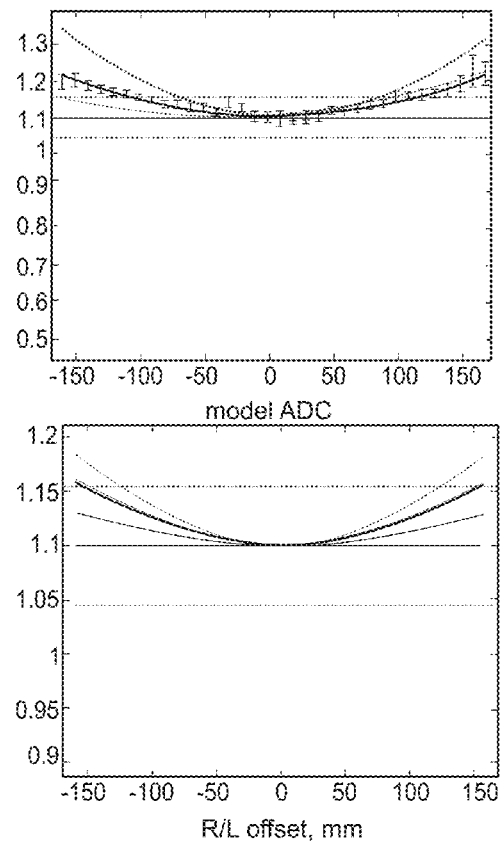
*Figure 4A*  *Figure 4B*

ERROR ANALYSIS AND CORRECTION OF MRI ADC MEASUREMENTS FOR GRADIENT NONLINEARITY

CROSS REFERENCE TO RELATED APPLICATIONS

The present application claims the benefit of U.S. Provisional Application No. 61/643,040, entitled "Error Analysis and Correction of MRI ADC Measurements for Gradient Nonlinearity", filed on May 4, 2012, and U.S. Provisional Application No. 61/703,600, entitled "Error Analysis and Correction of MRI ADC Measurements for Gradient Nonlinearity", filed on Sep. 20, 2012, both of which are hereby incorporated by reference herein in their entirety.

STATEMENT OF GOVERNMENT SUPPORT

This invention was made with government support under Contract Nos. P01-CA85878, SAIC 29XS161, T32-EB005172 and U01-CA166104 awarded by the National Institutes of Health. The government has certain rights in the invention.

BACKGROUND

Diffusion weighted imaging (DWI) is a widely used magnetic resonance (MR) modality for noninvasive diagnostics. One example diffusion quantity that clinical practitioners will measure is mean diffusivity, which is useful because it indirectly reflects tissue cellularity via water mobility and is independent of the relative orientation between the applied diffusion gradient directions and directional tissue cytoarchitecture. Mean diffusivity is commonly referred to as "apparent diffusion coefficient" (ADC) and may be determined from a variety of tissue/media-based models of how diffusion weighted MRI (DWI) signal changes with applied diffusion gradient strength. See, e.g., Riches et al., Diffusion-weighted imaging of the prostate and rectal wall: comparison of biexponential and monoexponential modelled diffusion and associated perfusion coefficients. NMR Biomed 2009; 22(3): 318-325; Lemke A, et al. Toward an optimal distribution of b values for intravoxel incoherent motion imaging. Magn Reson Imaging 2011; 29(6):766-776. Sensitivity to diffusion phenomena is controlled by a "b-value" which is derived from the full temporal DWI gradient waveform.

Absolute apparent diffusion coefficient (ADC) has been suggested as a potential biomarker for cancer diagnosis and treatment monitoring. See, Chenevert et al., Diffusion magnetic resonance imaging: an early surrogate marker of therapeutic efficacy in brain tumors. Journal of the National Cancer Institute 2000; 92:2029-2036; Padhani et al. Diffusion-weighted magnetic resonance imaging as a cancer biomarker: consensus and recommendations. Neoplasia 2009; 11:102-125.). To detect clinically significant changes in diffusion measurements, the sources of technical variability have to be well-characterized separately from biological changes. System designers desire to understand variations in results caused by equipment and testing conditions, to better control for such variations when measuring biological changes. The desire is heightened because for applications to be useful in clinical environment synchronization and standardization of diffusion measurement methodology among and across multiple MRI platforms is needed, otherwise multi-institutional studies and widespread clinical utilization can be hampered.

A significant platform-dependent variation has been identified as a source of spatial-dependent error in ADC measurement. Such errors have been demonstrated on commercial MRI equipment by using a temperature-controlled (ice water) phantom for a precisely known diffusion fluid. Chenevert et al., Diffusion coefficient measurement using temperature controlled fluid for quality control in multi-center studies. J Magn Reson Imag 2011; 34:983-987, and Chenevert et al., Multi-system repeatability and reproducibility of apparent diffusion coefficient measurement using an ice-water phantom" JMRI 2012. The testing showed that gradient non-linearity was the primary source of the error leading to a spatially-dependent b-value and subsequent ADC bias that can exceed 10-20% over clinically relevant FOVs on some systems. This platform-dependent bias results in spatial non-uniformity errors that substantially deteriorate quantitative DWI measurements.

The early accounts of DWI errors related to gradient non-linearity are now a decade old, see, Robson, Non-linear Gradients on Clinical MRI Systems Introduce Systematic Errors in ADC and DTI Measurements. In Proceedings of the 10th Annual Meeting of ISMRM, Honolulu, Hi., USA, 2002. p. 912), but the systematic bias problem has clearly persisted for contemporary clinical systems. This is presumably due to lack of practical correction procedures for vendor implementation for wide-scale non-research applications.

Previous research on non-linearity correction (see, Bammer et al., Analysis and generalized correction of the effect of spatial gradient field distortions in diffusion weighted imaging. Magn Reson Med 2003; 50:560-569 U.S. Pat. No. 6,969,991 and Janke et al., Use of Spherical Harmonic Deconvolution Methods to Compensate for Nonlinear Gradient Effects on MRI Images Magn Reson Med 2004; 52:115-122) described approaches for correction of diffusion tensor imaging (DTI) that required full spatial-mapping of the gradient coil fields as well as measuring of at least 6 non-collinear DWI gradient directions in each experiment. This comprehensive approach accounted for both direction and magnitude errors in diffusion tensor due to gradient nonlinearity, although the underlying mathematical algorithm is known to be susceptible to measurement noise (Laun et al., How background noise shifts eigenvectors and increases eigenvalues in DTI. Magn Reson Mater Phy 2009; 22:151-158). Furthermore, sampling of many directions, as required for DTI, prolongs image acquisition beyond the desired scantime for most clinical applications, where only a measure of mean diffusivity is sought. To streamline correction for background and imaging gradient errors in DTI, a simplified empiric DWI calibration algorithm was introduced (Wu et al., A Method for Calibrating Diffusion Gradients in Diffusion Tensor Imaging. J Comput Assist Tomogr. 2007; 31: 984-993) based on a regression model, without reference to the system's hardware characteristics. The approach was dependent upon gradient waveforms and did not generalize well to different scanner types and tissue properties. Others have incorporated the interaction of imaging gradients with diffusion gradients in their model (Ozcan A. Characterization of Imaging Gradients in Diffusion Tensor Imaging. J Magn Reson 2010; 207:24-33.), but failed to account for gradient nonlinearity and cross-terms. In short, the purported corrective techniques suggested thus far, whether for DTI, DWI, or otherwise, have not been successful in practical implementation of simultaneous corrections for gradient nonlinearity and cross terms corrupting mean diffusivity MRI measurement.

There is a desire to perform imaging using the fewest number of directional measurements that allow quantitation of mean diffusivity. In the absence of gradient nonlinearity, three orthogonal gradient directions would be adequate. However, as surmised by Bammer, gradient nonlinearity required solution via acquisition of at least six directions (much longer scantime) to derive three diffusion tensor characteristics from which mean diffusivity was calculated.

SUMMARY OF THE INVENTION

The application describes techniques to perform accurate mean diffusivity measurement of tissue throughout the imaged volume of the MRI system using no more than three orthogonal diffusion weighted images (DWIs) and correction steps that effectively remove bias error introduced by (i) spatially-dependent deviations of gradient strength from a nominal value, referred to herein as gradient nonlinearity, and (ii) induction of spatially-dependent spurious gradient fields perpendicular to the applied DWI gradient direction, referred to herein as cross-terms. These limitations in gradient hardware currently cause spatially-dependent bias in mean diffusivity measurements (~20% error) using conventional systems over the clinically relevant field-of-views (FOVs). In comparison to conventional systems, the present techniques can obviate the need for acquisition of at least 6 (and more commonly greater than 16) diffusion gradient directions and mathematical diagonalizations of the diffusion tensor. The described techniques are adequate for correcting for errors in diffusivity measurements of biological tissue or other sample medium, including anisotropic media that exhibit directionally-dependent diffusion qualities.

To correct the diffusion weighted images, we developed a b-matrix transformation that concentrates DWI energy into a single spatially-dependent element for each chosen DWI gradient direction. This technique can minimize the contribution of spatially-dependent b-matrix cross terms so their products with off-diagonal elements of the tissue diffusion tensor are negligible. Also with the technique corrected b-value maps may conveniently scale with nominal b-value for a chosen gradient direction. Thus, in various examples described, corresponding mean diffusivity correction may be achieved requiring only three orthogonal DWI directions that define the DWI frame of reference. For arbitrary DWI direction, this corrector may be in the form of the 3D-map for the norm of the spatially-dependent b-matrix. The corrector may include full non-linearity cross-terms, in some examples. In other examples, an approximation to the correction may be achieved by rotating the nonlinearity tensor into the DWI frame. Being an approximation for a complete diffusion tensor imaging system, the proposed correction can account for the bulk of the ADC error. The residual bias is reduced to below average experimental uncertainty (<2%) and correction efficiency improves for lower anisotropy media.

When the gradient non-linearity tensor is obtained for a particular MRI system design, correction maps can be pre-calculated once for an arbitrary waveform and scaled for different nominal b-values. In some examples, correction maps may be established for a set of commonly used gradient waveforms. In practice, the described correction may be implemented via three principal types: (i) providing corrected 3D b-value maps for the set of commonly-used gradient waveforms; (ii) providing corrected ADC maps; or (iii) providing corrected diffusion-weighted images.

In accordance with an example, a method of correcting diffusivity measurements of a medium of arbitrary anisotropy, includes; generating three-dimensional spatial correction maps for an arbitrary set of no more than three orthogonal diffusion gradient waveforms using gradient coil non-linearity characteristics of a magnetic resonance imaging (MRI) scanner, c, performing a diffusion weighted MRI scan of the medium using the selected arbitrary set of no more than three orthogonal diffusion gradient waveform at any nominal b-value, and acquiring diffusion weighted images (DWIs), applying the three-dimensional spatial correction maps to correct intensity of each pixel of the acquired DWIs to compensate for MRI scanner-specific gradient non-linearity bias, and determining corrected diffusivity images for a mean diffusivity of the medium from the corrected DWIs and nominal b-values.

In accordance with another example, a computer-readable storage medium having stored thereon a set of instructions, executable by a processor, for correcting diffusivity measurements of a medium of arbitrary anisotropy, the instructions including: instructions for generating three-dimensional spatial correction maps for an arbitrary set of no more than three orthogonal diffusion gradient waveforms using gradient coil non-linearity characteristics of a magnetic resonance imaging (MRI) scanner, c; instructions for performing a diffusion weighted MRI scan of the medium using the selected arbitrary set of no more than three orthogonal diffusion gradient waveform at any nominal b-value, and acquiring diffusion weighted images (DWIs); instructions for applying the three-dimensional spatial correction maps to correct intensity of each pixel of the acquired DWIs to compensate for MRI scanner-specific gradient non-linearity bias; and instructions for determining corrected diffusivity images for a mean diffusivity of the medium from the corrected DWIs and nominal b-values.

In accordance with another example, a method of correcting diffusivity measurements of a medium of arbitrary anisotropy, the diffusivity measurements taken by a magnetic resonance scanning system, the method includes: obtaining a set of diffusion imaging gradient waveforms, wherein the set of diffusion imaging gradient waveforms describe orientations of diffusion weighted image (DWI) gradients as three-coordinate vectors in a gradient coil frame of reference; performing a diffusion weighted scan of the medium, using the scanning system and any three orthogonal diffusion imaging gradient waveforms, to obtain a diffusion weighted magnetic resonance image set of the medium; obtaining a spatial correction map for each of the any three diffusion imaging gradient waveforms; and applying the spatial correction maps to the diffusion weighted magnetic resonance image set to correct for spatially-dependent bias errors in the diffusion weighted magnetic resonance image set.

In accordance with yet another example, a computer-readable storage medium having stored thereon a set of instructions, executable by a processor, for correcting diffusivity measurements of a medium of arbitrary anisotropy taken by a magnetic resonance scanning system, the instructions include: instructions for obtaining a set of diffusion imaging gradient waveforms, wherein the set of diffusion imaging gradient waveforms describe orientations of diffusion weighted image (DWI) gradients as three-coordinate vectors in a gradient coil frame of reference; instructions for performing a diffusion weighted scan of the medium, using the scanning system and any three orthogonal diffusion imaging gradient waveforms, to obtain a diffusion weighted magnetic resonance image set of the medium; instructions for obtaining a spatial correction map for each of the any three diffusion imaging gradient waveforms; and instructions for applying the spatial correction maps to the diffusion weighted magnetic resonance image set to correct for spatially-dependent bias errors in the diffusion weighted magnetic resonance image set.

BRIEF DESCRIPTION OF THE DRAWINGS

FIG. 2(b) FA=0.9. The bar scale is $10^{-3}$ mm²/sec.

FIGS. 4(a) and 4(b) are plots comparing measured spatial bias for ADC from isotropic phantom (FA=0, top row) to the model (bottom row) in case of DWI gradients along LAB for three separate directions and the trace, for each plot. FIG. 4(a) is a plot for an S/I offset. FIG. 4(b) is a plot for an UR offset. Error bars for the measured trace ADC correspond to a standard deviation over 1 cm ROI (approx. 90 pixels).

DETAILED DESCRIPTION

Figure 1:
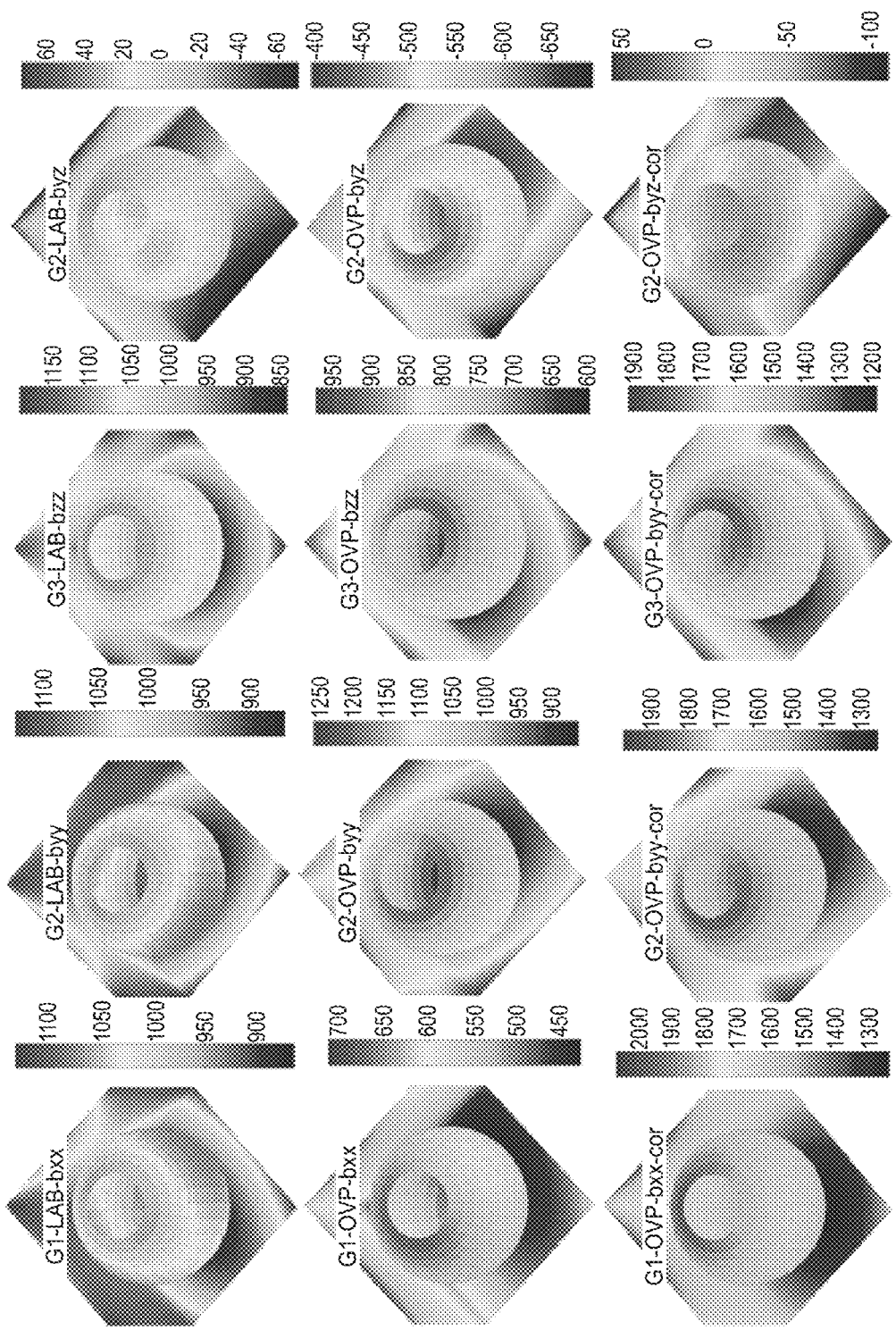
FIG. 1 is a plot of the spatial non-uniformity of diffusion weighting for a representative MRI system design. In columns from left-to-right: 3D-maps of leading diagonal b-terms ($b_{xx}$, $b_{yy}$, and $b_{zz}$) for each of three orthogonal DWI gradient levels (along the three columns) respectively, and with a representative cross-term, $b_{yz}$, for the second gradient direction (see, last column). The rows top-to-bottom correspond to DWI gradients along (i) the laboratory (LAB) frame axis (top), (ii) the "overplus" frame axis (OVP) before (middle), and (iii) the after (bottom) rotation "diagonalization" correction. Spatial dependence is illustrated by color gradient at boundary planes and spherical slices through field of view (FOV)=30×30×30 cm³. The bars to the right of each 3D-map, which are in color, correspond to the depicted scale of b-values (sec/mm²).

The present application describes techniques that may be implemented in MRI imaging systems and that may be built upon correcting physical characteristics of those MRI systems using minimal algorithm complexity for quantitative control of experimental error. The techniques correct ADC non-uniformity for conventional (three-direction) DWI acquisition by concentrating energy of a b-tensor to diagonal elements and including their spatial dependence. This technique is independent of gradient waveforms and scales with effective b-value at the isocenter. Thus despite gradient nonlinearity and tissue anisotropy, the techniques allow for sufficient ADC error control with only three-orthogonal gradient measurements. Correction efficiency is evaluated for a range of tissue-like diffusion tensor anisotropies and orientations. Both our theoretical model and simulation implementation were verified with actual phantom data. The correction techniques described herein may be implemented by clinical MRI vendors, allowing for wide spread inclusion in new and existing MRI (and other imaging) systems.

Tissue diffusivity can be modeled by diffusion tensor, $\hat{D}$, of the general form:

$$\hat{D} = \hat{V}(d_i \delta_{ij})\hat{V}^T, \text{ where } \hat{V}\hat{V}^T = \hat{E} \quad \text{Eq. 1}$$

$$FA = \sqrt{\frac{\sum_{ic}^{z}(d_i - d_j)^2}{2 \cdot \sum_{ic}^{z} d_i^2}} \quad \text{Eq. 2}$$

Here $\hat{D}$ is symmetric positive definite matrix that has orthogonal eigenvectors, $\hat{V}$, which therefore, form a rotation matrix (inverse is equal to transpose). The eigenvector matrix defines orientation of the diffusion ellipsoid in laboratory (LAB) frame of reference, where the tissue is "observed." Any arbitrary orientation of the tensor can be described by rotation of its eigenvectors V'=RV. Eigenvalues of the diffusion tensor, $d_i$>0, define the lengths of three orthogonal ellipsoid axes, which characterize anisotropic properties of the media, and are all equal for isotropic tissue (fractional anisotropy, FA=0, Eq. 2). The trace of the $\hat{D}$-tensor is invariant to rotation and is known as the mean diffusivity or apparent diffusion coefficient (ADC). In principle, this property can be measured for any three orthogonal directions independent of overall diffusion tensor orientation.

In conventional DWI MR experiments for three orthogonal gradient directions (k=1, 2, and 3), the diffusion tensor elements are related to measured image intensity ratios, $R=S_0/S_b$, of zero to non-zero diffusion gradient conditions through Eq. 3.

$$\ln R^k = \sum_{ij}^{x,y,z} b_{ij}^k D_{ij} \quad \text{Eq. 3}$$

where, $b_{ij}$, are the elements of 3×3 $\hat{b}$-tensor defining the strength of the applied gradients for each measurement (direction). The b-tensor elements are obtained by temporal integration of gradient waveforms according to:

$$\hat{b}_0 = \gamma 2 \int_0^{TE} dt \int_0^t \vec{G}_0(\tau) d\tau \int_0^t \vec{G}_0^T(\tau') d\tau';$$
$$\vec{G}_0 = (G_{x_0}, G_{y_0}, G_{z_0})^T \quad \text{Eq. 4}$$

Here γ is the gyromagnetic ratio, TE, is the echo time for the spin echo DWI sequence, and $\vec{G}_0$ is the gradient waveform described in "coil" coordinates, aka "LAB" (indicating active gradient coil elements). In general, this formalism accounts for temporal interaction between DWI and imaging gradient waveforms.

When the gradient strength, G, is independent of spatial coordinate, b-tensor is uniform in space and can be described by effective b-value for each orthogonal measurement. This assumption allows simple calculation of ADC in case of linear gradients:

$$ADC_{assumed} = 1/3 \sum_k^{1,2,3} \frac{1}{ab_{kk}}[\ln R^k]; ab_{kk} = b_{kk}(\vec{r} = \vec{0}) \quad \text{Eq. 5}$$

The strength of the gradient may vary depending on the spatial coordinate in the magnet bore. Due to this spatial dependence, gradients are produced in orthogonal directions with respect to the applied DWI pulses. Furthermore, this non-uniformity enhances temporal cross-terms between DWI and imaging gradients. To the first order, such variations can be described by spatially-dependent non-linearity tensor (Bammer et al., Analysis and generalized correction of the effect of spatial gradient field distortions in diffusion weighted imaging. Magn Reson Med 2003; 50:560-569), $\hat{L}$:

$$\vec{G}(\vec{r}) = \hat{L}(\vec{r})\vec{G}_n.\quad\text{Eq. 6}$$

This gradient non-linearity consequently leads to spatial dependence of the $\hat{b}'$-tensor (Eq. 3,4). Therefore, each DWI experiment (individual gradient direction) will produce a b'-tensor of nine 3D elements:

$$\hat{b}'(\vec{r}) = \hat{L}(\vec{r})\hat{b}_0\hat{L}^\tau(\vec{r})\quad\text{Eq. 7}$$

Spatial dependence of the b'-tensor is fully controlled by spatial dependence of the gradient non-linearity tensor, while the effective scale (power of each $b_{ij}$-element) is determined by the temporal gradient waveform (Eq. 4) In general case, the presence of large non-uniform gradient cross-terms will lead to non-uniformity of b-elements, complicating interpretation of measured DWI intensity ratios (Eq. 3).

As suggested by Bammer, et al., (see, e.g. Bammer et al. Analysis and generalized correction of the effect of spatial gradient field distortions in diffusion weighted imaging. Magn Reson Med 2003; 50:560-569 and U.S. Pat. No. 6,969,991), nine 3D-elements of the gradient non-linearity tensor, $\hat{L}$, can be calculated by numerical differentiation of the gradient coil fields in Cartesian coordinates:

$$L_{ij}(\vec{r}) = \frac{\partial B_z^{Gi}}{\partial r_j G_{io}}, \hat{L} \neq \hat{L}^T\quad\text{Eq. 8}$$

$B_z^G$ projection of the static magnetic field from gradient coils is provided by general solution to Laplace equation (Romeo et al., Magnet Field Profiling: Analysis and Correcting Coil Design. Magn Reson Med 1984; 1:44-65) based on spherical harmonic, $T_{nl}$, functions of Legendre polynomials, $P_{nl}$. Specific gradient coil design and system symmetry is reflected in spatially-independent expansion coefficients, $a^G_{nl}$ and $b^G_{nl}$, (Janke et al., Use of Spherical Harmonic Deconvolution Methods to Compensate for Non-linear Gradient Effects on MRI Images Magn Reson Med 2004; 52:115-122) and should be available from an MRI vendor in the general case (single table of coefficients per system). The spatial dependence of the magnetic field is fully contained in the basis functions of the expansion:

$$B_z^G(\vec{r}) = \sum_{n=0}^{7}\sum_{l=0}^{n}[a_{nl}^G ReT_{nl}(\vec{r}) + b_{nl}^G ImT_{nl}(\vec{r})]\quad\text{Eq. 9}$$

$$T_{nl}(\vec{r}) = \left(\frac{r}{r_c}\right)^n P_{nl}(\cos\theta)e^{il\varphi}\quad\text{Eq. 10}$$

Here $\theta$ and $\varphi$ are latitude and longitude angles for spherical coordinate representation defined over $0\ldots\pi$ and $0\ldots 2\pi$, respectively; r is the distance from isocenter and $r_c$ is the characteristic radius of Z-coil (magnet bore). Equations 9 and 10 produce three 3D-maps of G=X, Y, and Z-gradient fields. The diagonal elements of $\hat{L}$-tensor will describe non-linearity along the gradient coil direction, while off-diagonal cross-terms will characterize the gradients created orthogonally to a desired direction. Note that gradient non-linearity is a characteristic of the hardware system only and can be determined once and used for multiple DWI measurements independent of tissue properties.

From the full expansion of Eq. 3, including spatial dependence of b'-tensor, true (uniform) apparent diffusion coefficient, can be expressed as follows:

$$ADC_{true} =\quad\text{Eq. 11}$$

$$1/3Tr(\hat{D}) = 1/3\sum_k^{1,2,3}\frac{1}{b'_{kk}}\left[lnR^k\ldots - D_{ii}b_{ii}^{k'}(1-\delta_{ik}) - \sum_{i\neq j}^{x,y,z}D_{ij}b_{ij}^{k'}\right]$$

Similar to Eq. 5, this expression factors out the leading diagonal term of each of the three required orthogonal gradient experiments (k). Note that off-diagonal ($i \neq j$) terms may have non-zero contribution for anisotropic diffusion tensor, which is unknown in the real experiment. Thus, in the general case, the correction of spatial ADC bias would involve a solution of complex DTI-like "eigen"-problem, which requires more than six DWI-directions and is sensitive to measurement noise (see, Laun F B, Schad L R, Klein J, Stieltjes B. How background noise shifts eigenvectors and increases eigenvalues in DTI. Magn Reson Mater Phy 2009; 22:151-158). The off-diagonal terms are effectively eliminated in the case of FA=0 medium, leaving "extra" contribution only from non-leading diagonal terms, $i \neq k$ (e.g., due to temporal gradient cross-talk).

To devise simplified, but viable non-uniformity correction procedure, comparing expression in Eq. 11 a to Eq. 5, we identified the major sources of systematic error for general DWI experiment as both the presence of large off-diagonal b-terms and spatial dependence of b-tensor. Since ADC and intensity-ratios are rotation invariants, contribution of error terms can be minimized by rotating b-tensor elements into a frame where it is effectively reduced to diagonal form both in temporal and spatial sense and allow simplification of Eq. 3 to:

$$\ln R^k \cong {}^c b_{kk} D_{kk}.\quad\text{Eq. 12}$$

To obtain our correction we derived the b-matrix transformation that concentrates energy of the 3 by 3 spatially-dependent b-matrix into a single spatially-dependent element per $k^{th}$ DWI gradient direction, $$^cb_{kk}(\vec{r}) = b_0 C^k(\vec{r}).\quad\text{Eq. 13}$$

where $C^k(\vec{r})$ is a spatial bias map normalized to nominal b-value at magnet isocenter, $b_0$, in $k^{th}$ experiment. We found that this procedure minimizes contribution of spatially-dependent b-matrix cross terms, $b_{i\neq j}^k$, so their products with off-diagonal elements of the tissue diffusion tensor are small allowing for the following approximation, $$\Sigma_{i,j}^{x,y,z} b_{ij}^k D_{ij} \cong {}^cb_{kk}D_{kk}.\quad\text{Eq. 14}$$

Note, $^cb_{kk}(\vec{r})$ will conveniently scale with $b_0$ and will depend only on gradient direction. Corresponding ADC correction requires only three orthogonal DWI directions that define the DWI frame of reference. For arbitrary DWI direction, corrector $C^k(\vec{r})$ is the largest nonzero eigenvalue of spatially-dependent b'-matrix which is equal to its norm:

$$C^k(\vec{r}) = \sqrt{\{\Sigma_{i=1}^3 (b_{ij}^k)^2 + \Sigma_{i<j}^3 (b_{ij}^k)^2\}/b_0^2}.\quad\text{Eq. 15}$$

Here spatial dependence of ij-element of the b-matrix for $k^{th}$ DWI direction is described by: $b_{ij}^k = \vec{L}_i^T \hat{b}_0^k \vec{L}_j$, where $\vec{L}_i = (L_{i1}, L_{i2}, L_{i3})^T$ is the $i^{th}$ column of gradient nonlinearity tensor $\hat{L}(\vec{r})$ as defined by Bammer et al., Analysis and generalized correction of the effect of spatial gradient field distortions in diffusion weighted imaging. Magn Reson Med 2003; 50:560-569. Therefore the corrector $C^k(\vec{r})$ will depend on the non-linearity cross-terms (off-diagonal elements of non-symmetric nonlinearity tensor) that cause the spurious gradients in directions orthogonal to applied DWI gradient. This formalism uses knowledge of the full spatially-independent $\hat{b}_0^k$-matrix at isocenter (Eq. 4) and spatially-dependent $\hat{L}$-tensor.

Alternatively, an approximation to the correction can be obtained by rotation of the nonlinearity tensor into the DWI "g"-frame defined by the effective orthogonal gradients thereby forcing smaller spatial cross-terms:

$$C^k(\vec{r}) = \hat{L}^g(\vec{r})\hat{L}^{gT}(\vec{r}), \text{ where } \hat{L}^g(\vec{r}) = \vec{R}_k^T \hat{L}(\vec{r}) \vec{R}_k \qquad \text{Eq. 16}$$

where $\vec{R}_k = (R_{xk}^g, R_{yk}^g, R_{zk}^g)^T$ is a unit vector in direction of the $k^{th}$ DWI waveform.

Here, the corrected $^cb_{kk}$-map is proportional to the scalar nominal b-value, while its spatial dependence is determined by the square of nonlinearity tensor, $\hat{L}$, "projected" on the gradient direction. Residual error due to off-diagonal b-terms is negligible, but may have finite value. Note that in the general case, the spatial dependence of correction terms will include contribution from both diagonal and off-diagonal L-elements. Only for DWI-gradient directions coinciding with the LAB axes ($R^g=E$), this can be further simplified to produce: $^cb_{kk}(LAB) = b_{eff}^k L_{kk}^2$, where spatial dependence of correction is fully described by gradient non-linearity along the gradient direction alone (Bernstein et al., U.S. Pat. No. 6,163,152).

Finally, the corrected ADC value can be obtained using the same mathematical formalism as in Eq. 5 and replacing "assumed" $^ab_{kk}$ terms with "corrected" $^cb_{kk}$ that includes spatial dependence of only the leading terms of diagonal b-matrix elements:

$$ADC^c = \frac{1}{zb_o}\sum_k^3 \frac{lnR^k}{c^k(\vec{r})} = \frac{1}{zb_o}\sum_k^3 \frac{lnS_o - lnS_{b'}^k}{c^k(\vec{r})} \qquad \text{Eq. 17}$$

In practice, it may be more desirable to correct actual DWI intensity as a function of space before ADC calculations for greater portability and flexibility in choice of the tissue diffusion model (e.g. mono- vs multi-exponential model). This can be achieved by:

$$S_b^c = S_0 e^{\frac{lnR^k}{c^k(\vec{r})}} = S_0^{\frac{c^k(\vec{r})-1}{c^k(\vec{r})}} S_{b'}^{\frac{1}{c^k(\vec{r})}} \qquad \text{Eq. 18}$$

Note that both described correction procedures (Eq. 15,16) use only three orthogonal measurements and avoid matrix inversion or solution of eigenvalue problem, which are more sensitive to the ln(R) measurement noise (Laun et al., How background noise shifts eigenvectors and increases eigenvalues in DTI. Magn Reson Mater Phy 2009; 22:151-158).

Gradient non-linearity is a characteristic of the hardware system only; thus, it may be determined only once and used for multiple DWI measurements, correcting for diffusion assessments independent of tissue properties. When the gradient non-linearity tensor is obtained for a particular system, correction maps $C^k(\vec{r})$ may then be pre-calculated once for each in the set of commonly used gradient waveforms and scaled for different nominal b-values. We describe, for example, three types of corrections:

I. Provide corrected 3D b-value maps for the set of k commonly-used gradient waveforms: $^cb_{kk}(\vec{r})$ or equivalently $C^k(\vec{r})$.

II. Provide corrected ADC maps:

$$ADC^c = \frac{1}{zb_o}\sum_k^3 \frac{lnS_o - lnS_{b'}^k}{c^k(\vec{r})}$$

(assuming same nominal $b_0$-value for all 3 orthogonal DWI directions).

III. Provide corrected diffusion-weighted images:

$$S_b^c = S_0^{\frac{c^k(\vec{r})-1}{c^k(\vec{r})}} S_{b'}^{\frac{1}{c^k(\vec{r})}};$$

where $S_0$ is the unweighted (ie. b=0) image and $S_{b'}$ is the acquired uncorrected diffusion-weighted image.

Implementation Type I is independent of actual patient images. The corrective functions may be pre-calculated once for the set of commonly-used DWI gradient waveforms, are stored on the MRI system or exported for offline analysis of DWI. Also, the corrective functions are scalable by the nominal b-value. This approach allows one to apply any model of diffusion signal evolution as a function of b-value to the patients' DWI. Linkage between the appropriate corrective functions and the specific DWI acquired on patients is straightforward on the MRI system where all acquisition conditions are available. However, when corrective functions and DWI are combined by offline analysis systems, additional geometric information would accompany the DWI. This can, in some examples, present logistical issues given the wide variety of offline systems used for diffusion analysis. For a given patients' DWI, the specific gradient waveform, noted herein by the "k" index, would be relayed to the offline system along with scan table offset values in order for the offline system to properly spatially link the corrective 3D functions with the DWI. Currently, medical images retain spatial content in standard DICOM elements (i.e., "public tags") within DICOM image headers, although the spatial content is defined in a patient-based coordinate system. Gradient nonlinearity, on the other hand, is defined within a magnet-based coordinate system. In principle, one could link patient-based and magnet-based coordinate systems as long as the standard DICOM element for patient entry (e.g. head first, supine) is utilized and any incremental spatial offset between patient-based and magnet-based coordinate systems is made available. For various technical reasons, however, the scan table is variably offset during the MRI exam such that the center of the imaged volume is not necessarily located at the patient-based origin and also not necessarily at the center of the magnet-based coordinate system. This incremental spatial offset is not currently retained in public DICOM tags.

Implementation Type II provides quantitatively correct ADC values (in terms of gradient nonlinearity) for medical interpretation. ADC maps are commonly used in current clinical practice so these spatially-corrected ADC maps would be fully portable for offline interpretation. Implementation Type II presumes and applies the model between DWI signal evolution and b-value, and thus may be less flexible to apply alternative models unless all these models are available on the system. For example, calculation of ADC values over a subset range of b-values and multi-exponential fitting of DWI versus b-value are two alternative models that cannot be derived from ADC maps calculated by mono-exponential fitting of DWI over the full acquired range of b-values. Moreover, the DWI images themselves are still heavily used for medical interpretation and analysis. Therefore, implementation Type I may still be desired even though corrected ADC maps were made available.

Implementation Type III offers similar features to Types I and II. The corrective functions are pre-calculated once and are stored on the MRI system for internal use. Each acquired DWI can be spatially corrected for the applied b-value and gradient waveform in real time and on the scanner. Since this correction is performed directly on the scanner system, information regarding acquisition conditions and linkage between patient-based and magnet-based coordinate systems is available internally without the need to relay these conditions via DICOM image headers to offline systems. Once the individual image intensities of each DWI are corrected as a function of spatial location, they are fully portable. The full array of existing online/offline diffusion analysis routines do not need any modification and can be applied directly to the spatially-corrected DWI. Once the DWI intensities are corrected, only the nominal b-value (a scaler) is required for subsequent processing/interpretation as is currently done. This implementation will yield quantitative diffusion values largely free of gradient nonlinearity bias and still allow application of any DWI versus b-value tissue model, thus offering greater flexibility.

Example Implementations (1) Phantom

An ice-water based isotropic DWI phantom was devised with known ADC=$1.1\times10^{-3}$ mm$^2$/s (20). One long 30 mm diameter tube filled with distilled water provided the universal ADC standard (FIG. 1). The phantom was constructed from a 50-mL polypropylene conical tube (30×115 mm) and 3000-mL polypropylene wide-mouth jar. The 200-mL tube was filled with distilled water, capped, and cemented to the underside of the 3000 mL jar top. Prior to diffusion measurements, cubed or crushed ice and water were added such that ice filled the full extent of the jar. By screwing on the jar top, the 200-mL tube of water was held in the center icewater mixture. The phantom was wrapped in a hospital "blue pad" for insulation and to absorb surface condensate. Following preparation of the phantom, ~60 minutes was allowed to reach thermal equilibrium. The ice-water thermostat provided temperature control to 0° C. for several hours and allowed ADC measurement accuracy within 2% STD.

(2) MRI Data Acquisition Protocol

A 3T clinical MR system (Philips Ingenia) was used. TR=8000 ms; TE=100 ms; Acquisition matrix=128×128; Phase=Anterior/Posterior (A/P), Freq.=Right/Left (R/L); FOV=240×240 mm; 25 slices, 6 mm thick, 1 mm gap; Bandwidth=1.5-2.6 kHz/pixel; NEX=1; No parallel imaging. Two DWI pulse sequences were considered with temporal gradient waveforms applied on three orthogonal axes. For the first sequence, denoted "LAB", had nominal b-value=1000 s/mm$^2$, single DWI gradient channel was active at a time (DW axes=X, Y, Z); whereas for the second sequence, denoted overplus "OVP", applied multiple gradient channels simultaneously for nominal b-value=1000 s/mm$^2$. For the LAB sequence, ADC measurements on the isotropic ice-water phantom were performed both for three separate direction measurements and the resultant trace DWI defined as the geometric mean of individual axis DWI x,y,z. Off-center measurements were performed using torso coil and repositioning the phantom with 50 mm overlap in superior/inferior (S/I) and right/left (R/L) directions. Axial measurements along the central tube provided a spatial extent of approximately +/−160 mm (limited by coil connector length) in the S/I direction. Sagittal measurements were used for R/L offset extending to +/−170 (limited by bore size).

(3) Hardware Model Parameters

Gradient waveforms were modeled by computer simulation for the two pulse sequences using three orthogonal DWI gradients applied independently along X, Y, Z directions "LAB" (nominal b=1010) as well as for a combined X+Y+Z axes "OVP" scenario (e.g. nominal b=1510). Square waveforms were used as diffusion pulse models. The duration of the DW pulses was 30 ms, 4 ms slice select and SE pulse, TE=100 ms, with 3.2 ms read-out. Imaging gradient contribution to b-cross-terms was included through temporal numerical integration of gradient waveforms Eq. 4 (similar to experimental sequences). The spatial dependence of b-terms was modeled according to above-described formalism within a 30×30×30 cm$^3$ volume sampled every 5 mm. Spatial dependence of gradient coil fields was described via spherical harmonic expansion to the 7$^{th}$ order (see, Janke et al., Use of Spherical Harmonic Deconvolution Methods to Compensate for Nonlinear Gradient Effects on MRI Images Magn Reson Med 2004; 52:115-122.) skipping all even terms ($r_c$=40 cm). Magnetic field for the G=Y-coil was obtained by 90° rotation of the G=X-gradient field. These model constraints were equivalent to the following relations for the model coefficients: $a_{nl}^Y=-b_{nl}^X$; $a_{nl}^X=b_{nl}^Y$; $a_{zk,l}^G=b_{zk,l}^G=0$. Nine 3D-elements of gradient non-linearity tensor were obtained by numeric differentiation of the gradient coil fields in Eq. 9 along three Cartesian axis and subsequent normalization by the gradient value at isocenter (Eq. 8).

(4) Tissue Diffusion Model

Diffusion properties of the media were modeled using a diffusion tensor with tissue-like characteristics: ADC=1.0 and FA=0.0, 0.3, 0.5, 0.7 and 0.9. Diffusion tensor orientation was varied uniformly in respect to the lab (gradient) system by consecutive rotations around X-Y-X axes (0 . . . π/2, 0 . . . π/2, 0 . . . 2π) with a constant step of 9° around X, and scaled (to achieve constant solid angle arc length) around Y, resulting in 2150 uniform D-tensor orientations. The uniformity was checked by visualization of D-ellipsoid rotation for 100-300 orientations. "True" spatial dependence of ADC was obtained according to Eq. 11 using the complete gradient non-linearity and tissue model description. Assumed ADC was obtained according to Eq. 5 using effective b-values at isocenter (ignoring spatial dependence). The corrected ADC was calculated using spatially dependent "corrected" $^c$b-terms obtained either by rotation into DWI system (Eq. 16) or by b-norm (Eq. 15) substituted into Eq. 5, assuming only knowledge of hardware parameters (gradient orientation and non-linearity tensor).

(5) ADC Error Analysis

ADC errors were calculated as deviation from true (model) value for each pixel in 3D-volume within 30 cm FOV (FIG. 1). Error statistics histograms were compared for ADC with and without b-correction. The histograms were characterized by mean, median, 95-percentile, range and root-mean-square-error (RMSE) measured over the full image volume. To characterize orientation dependence of the error, FOV-RMSE histograms were explored. The figure of merit for the correction procedure was defined as orientation-mean of the FOV-RMSE. The total efficiency of the correction was measured as percent corrected mean RMSE. To check that error statistics is independent of model parameters, in addition to the model parameters listed above, b-value of 1000 and ADC=2 were also tried with OVP for extreme anisotropy values of FA=0 and FA=0.9. Lastly, the simulated one-dimensional ADC dependence along Z and X were compared to experimental phantom results with S/I and R/L offset, respectively.

Results

For media with arbitrary diffusion anisotropy, single ADC measurement requires three orthogonal DWI gradients, which produce three b-tensors of nine elements each (Eq. 4). Gradient nonlinearity will transform these 27 elements into 27 3D-maps according to Eq. 7. FIG. 1 illustrates spatial dependence of diagonal elements of b-tensor (one leading term per gradient direction in columns) and a relative strength of an off-diagonal term (last column). For these and subsequent 3D maps, spatial nonuniformity is depicted by color scale along the back cut-planes and on spherical/cylindrical surfaces within the volume. The nominal (desired) b-value is achieved at the isocenter—center of a spherical slice through the volume. Spatial deviation from nominal value increases towards the FOV boundaries.

The first row in FIG. 1 depicts b-terms for the LAB gradient scenario, where the contribution of off-diagonal elements, e.g., $b_{yz}$, is below 10% of the diagonal values. Note that for LAB-gradients, spatial dependence of "corrected" b-terms, $^cb$ Eq. 13, is equivalent to those depicted for diagonal b-terms, while the off-diagonal term contribution is ignored. Similar to X and Y gradient coil fields (Eq. 9) in the LAB, spatial dependence of the $b_{xx}$ (leading b-term for X-DWI gradient) is rotated 90-degrees around Z-axis compared to $b_{yy}$, while $b_{zz}$ retains characteristic cylindrical symmetry of Z-coil.

The second row in FIG. 1 shows spatial dependence of the representative b-terms for the OVP gradient directions. Here off-diagonal b-term contribution becomes order of diagonal terms (e.g., $b_{yz}$ magnitude is comparable to $b_{xx}$). As is evident from boundary plane projections, spatial symmetries of the OVP b-terms are no longer directly reflecting those of the gradient coil fields (unlike LAB gradients in first row of FIG. 1). Spatial maps of corrected OVP $^cb$-terms (Eq. 13), plotted in the third row of FIG. 1, recover some original symmetry via rotation of nonlinearity tensor Eq. 16 in to OVP-frame. Furthermore, leading (diagonal) $^cb$-terms acquire higher effective magnitude, while off-diagonal contribution becomes below 10% of diagonal b-magnitude over the FOV. When corrected $^cb$-terms are approximated by Eq. 15, the off-diagonal contribution is completely eliminated ($b_{yz}$=0, not shown), and the spatial dependence of leading diagonal b-terms remains similar to that depicted in FIG. 1 (third row), except for slightly higher (~2%) effective magnitude range.

FIG. 2 compares tiled ADC Z-slice images obtained with complete nonlinearity model for three orthogonal OVP DWI-gradients to those after $^cb$-correction in case of isotropic (FA=0) and highly anisotropic (FA=0.9) diffusion media for an arbitrary orientation of diffusion tensor in respect to magnet axis. Non-uniformity of uncorrected ADC is higher for an anisotropic medium, while correction efficiency is lower, especially toward the FOV edges. For an isotropic case, ADC non-uniformity is effectively removed by correction.

Figures 2A, 2B:
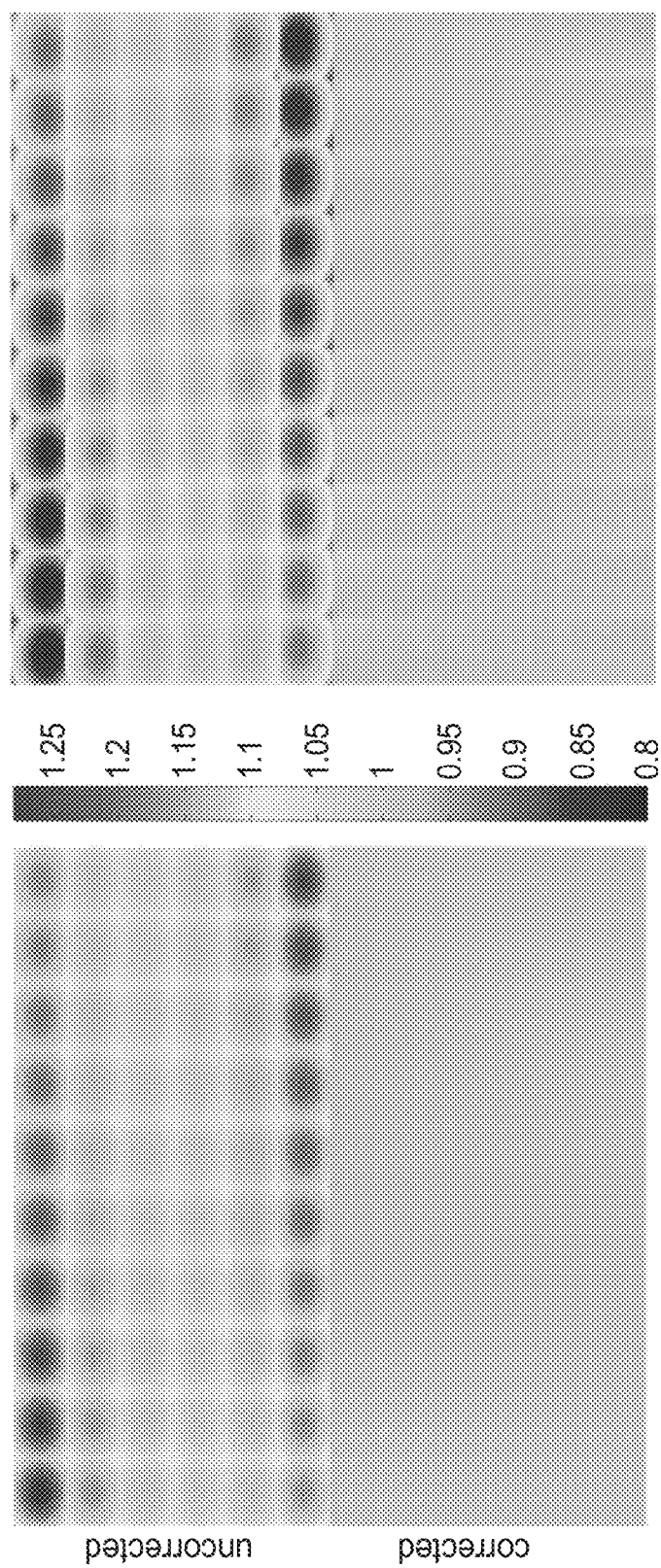
FIGS. 2(a) and 2(b) illustrate corrected versus uncorrected ADC data for 60 image slices through FOV=30×30×30 cm³ for single arbitrary diffusion-tensor orientation FIG. 2(a) FA=0.

The absolute ADC non-uniformity error within FOV is summarized for several anisotropy values in histograms of FIG. 2a. FIG. 2b shows the average correction efficiency for two DWI gradient direction scenarios. Both uncorrected (light bars) and residual (dark bars) error histograms become broader with increasing FA of the medium. The relative width of the histograms described by ratio of their corresponding mean RMSE (averaged over 2510 uniform diffusion tensor orientations) is shown in FIG. 2b. This ratio reflects efficiency of the correction procedure, which decreases with increasing FA. Higher overall efficiency is achievable for OVP gradients. The absolute error reduction for ADC non-uniformity achieved through leading-term correction procedure was from 90 to 70% for FA from 0.3 to 0.9, and better than 97% for FA=0.

FIG. 4 illustrates qualitative agreement between calculated 1D-spatial dependence of ADC and our experimental observations for isotropic ice-water phantom run on a clinical scanner with the LAB DWI-gradients. For all three separate gradient directions and the trace, both observed (top) and calculated (bottom) ADC are quadratically underestimated along SI, while overestimated along RL compared to true values (solid horizontal line) for 1D slice through the isocenter. The non-uniformity bias is significantly higher (>10%) than standard deviation of the measurement within ROI (<2%, error bars) for FOV>5 cm.

The disclosure provides viable correction procedures for observed spatial non-uniformity bias of ADC under arbitrary anisotropy of the medium in a fewest number of measurements. In some examples, the techniques assume knowledge of gradient coil fields Eq. 9 and DWI-pulse sequence Eq. 4. These are independent of the patient and can be obtained once per gradient/system design. Inclusion of spatial and temporal gradient cross-terms interacting with tissue anisotropy complicates interpretation of measured DWI intensity ratios (Eq. 3). The source of ADC non-uniformity bias in conventional experiment (Eq. 5) for media of arbitrary anisotropy is spatial dependence of all b-tensor elements (Eq. 11). Thus, for an arbitrary DWI-direction, complete description of the system requires nine 3D-maps for b'-tensor elements (27 for three orthogonal experiments). The effective scale (power of each $b_{ij}$-element) is determined by the temporal gradient waveform (Eq. 4). Spatial dependence of the b'-tensor elements is determined by spatial dependence of the gradient non-linearity tensor (Eq. 7) as well as DWI-gradient frame orientation in respect to the gradient-coil frame (FIG. 1, row one versus two). Fortunately, a good approximation to the complete system description can be achieved with only three measurements.

Contribution of $b_{ij}$ cross-terms (i< >j) is small for the LAB gradients (FIG. 1, first row), which effectively eliminates cross-terms with off-diagonal diffusion tensor elements in Eq. 11 (generally unknown). Diagonal cross-terms due to imaging gradients are smaller than off-diagonal cross-terms and can be ignored (similar to in $b_{yz}$ FIG. 1 first row). This allows simplified non-uniformity correction procedure that uses only spatial dependence of single (leading) $^cb_{kk}$-element corresponding to an active gradient coil ($k^{th}$ DWI-direction.) Thus, three orthogonal DWI measurements are sufficient to describe spatial non-uniformity of D-trace (and ADC) for LAB experiment. Furthermore, since $R^g$=E in Eq. 16, only diagonal elements of gradient non-linearity tensor would contribute to spatial dependence of effective $^cb$. Therefore, the sufficient description in LAB is obtained by including only nonlinearity of coil fields collinear with gradient direction ($L_{kk}(r)$).

The apparent simplification achieved for LAB-gradients prompts for general correction formalism in case of arbitrary DWI-direction to concentrate energy of b-tensor in a single element per measurement and reduce contribution of $b_{ij}$-cross-terms. As described hereinabove, such formalism can be implemented by either using effective b-value and rotating nonlinearity tensor in to applied DWI-gradient frame Eq. 16 (effective diagnalization), or directly diagonalizing b-tensor for each point in space Eq. 15 per pulse sequence. Whether "direct" or "effective," this b'-diagonalization procedure would produce single 3D-map for "corrected" $^cb$-term per DWI-direction and minimize error due to cross-term contribution (FIG. 1, third row.) Such procedure is always possible for symmetric positive-definite b-tensor assuming three orthogonal DWI-directions for an ADC measurement, which define rotation transformation $R^g$ (Eq. 16). Unlike LAB gradients, for arbitrary DWI direction away from LAB axis (e.g., OVP) the corrected $^cb_{kk}$-terms will include coil fields both collinear and orthogonal to gradient direction. The resulting spatial maps of "corrected" (effective) $^cb$-terms, described by complete gradient non-linearity tensor (Eq. 8), need to be obtained only once for a particular DWI-direction, and can be simply scaled for different nominal b-value. This procedure is independent of the patient and requires only three measurements similar to conventional (uncorrected) approach.

Note that due to different spatial dependence of corrected $^cb$-terms (FIG. 1), in principle, there is no single b-value for a single point in space that can be factored out to use geometric average of measured intensity ratios for an ADC calculation in Eq. 5. Instead, spatial dependence of effective b-terms has to be corrected separately for individual gradient directions before combining for ADC calculation. In other words, this correction procedure provides diagonal components of diffusion tensor $D_{11}$, $D_{22}$, and $D_{33}$ along three orthogonal gradient directions used in an ADC-experiment. These values will depend on orientation of the frame defined by diffusion gradients, and in general case, will not represent the principal values of diffusion tensor ($d_1$, $d_2$, and $d_3$, required for FA estimate). Due to degeneracy of diagnalized $^cb$-tensor, information on diffusion tensor orientation is lost by diagonalization procedure, while off-diagonal elements, $b_{i \neq j}$, are needed for full DTI measurement to obtain FA.

Figures 3A, 3B:
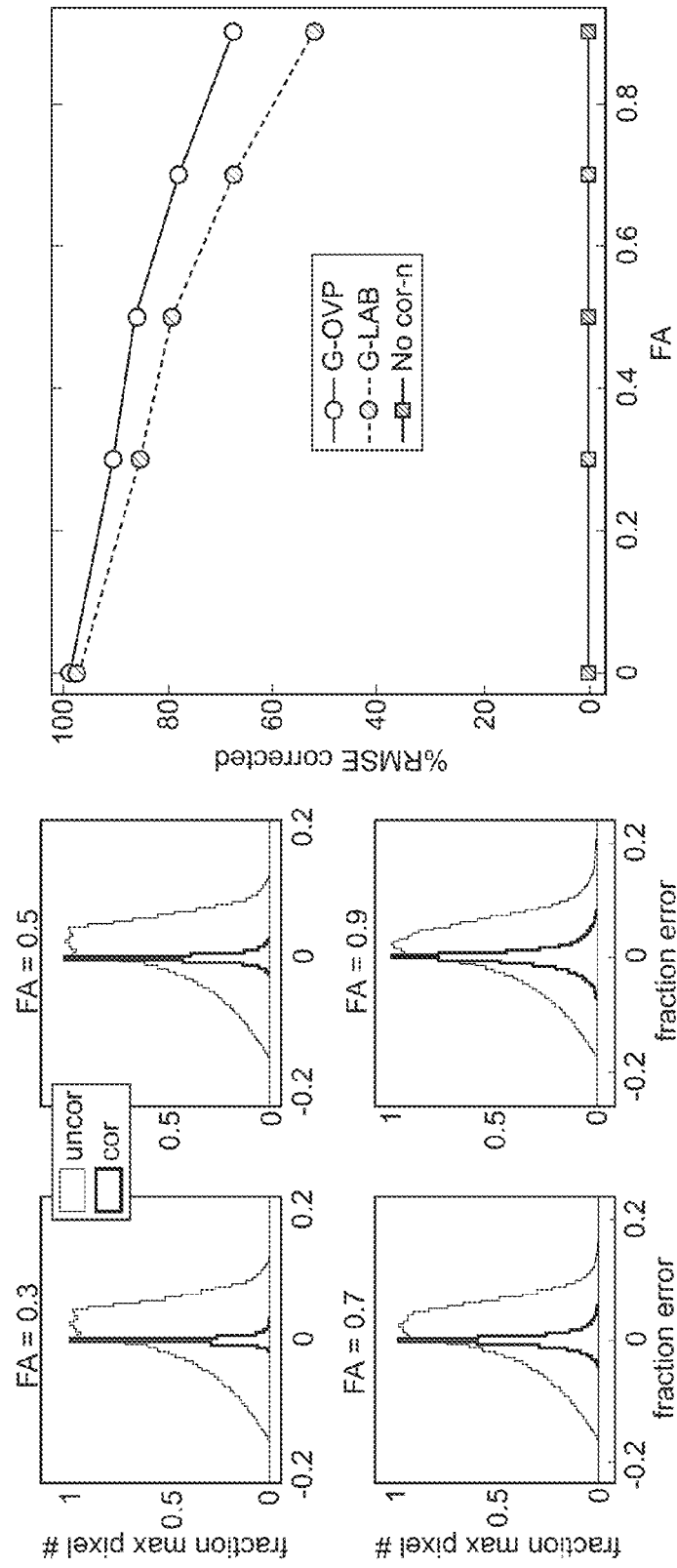
FIG. 3(a) illustrates corrected (dark) versus uncorrected (light grey) error histograms (scaled to maximum pixel number) for four different FA values, as shown, and 2510 uniform diffusion-tensor orientations within FOV=30×30×30 cm³.
FIG. 3(b) is a plot of total correction efficiency (% RMSE) as a function of FA for all pixels within FOV averaged over 2510 diffusion tensor orientations.

After suggested leading-term correction, residual error-distribution for ADC will depend on anisotropic properties of the media and relative orientation of gradient fields. The residual error is determined by spatial dependence of cross-talk terms with imaging gradients, which slightly perturbs orientation of "effective" DWI gradient frame and is neglected by our simplified correction procedure. The minimal residual error can be predicted for isotropic media, where $D_{i < > j} = 0$, and off-diagonal cross-terms are effectively eliminated in Eq. 11. This is confirmed by our results illustrated in FIG. 2a, where non-uniformity bias is nearly removed for FA=0 by our correction procedure. For anisotropic case (FIG. 2b), residual error exhibits clear orientation dependence and is larger for the regions further from isocenter. The number of pixels with higher ADC non-uniformity error decreases approximately exponentially with the bias value (FIG. 3a). Negative skew of the pixel histograms of ADC error before correction is independent of FA and reflects intrinsic asymmetry in the gradient coil field model. Higher symmetry of residual error histograms after correction confirms that no additional spatial bias is introduced by our simplified correction procedure.

Both corrected and uncorrected error histograms (FIG. 3a) become broader with growing anisotropy. The relative amount of error corrected for all pixels within FOV can be measured from the ratio of the histogram RMSE before and after correction (FIG. 3b). The histogram statistics does not change when using model ADC=$2 \times 10^{-3}$ mm$^2$/s versus $1 \times 10^{-3}$ mm$^2$/s or b-value of 1500 s/mm$^2$ versus 1000 s/mm$^2$ for FA=0 and 0.9, confirming that presented error correction efficiency estimate is independent of actual ADC or effective b-value. Therefore, the proposed error correction procedure is adequate for arbitrary experimental conditions. Single anisotropy value for all pixels within FOV used by our model is purely hypothetical scenario. More practical assumption is the distribution of anisotropies, with prevalence of lower anisotropies observed for non-neuro and disease tissues. In the reasonable anisotropy range (FA<0.5), the proposed correction procedure removes >90% of error and reduces ADC nonuniformity bias to below experimental uncertainty (<2%, FIG. 4) over clinically relevant FOVs.

The bias error predicted by the model along S/I and R/L direction was compared to experimental measurements using a temperature-controlled isotropic phantom. Using the ice-phantom allowed exclusion of obscuring effects of temperature gradients from evaluation of technical bias for ADC measurement. Large ADC measurement error (exceeding 10%) was observed with 150 mm offset from center in superior-inferior (SI) and left-right (LR) direction, as depicted in FIG. 4 for torso coil. Measured ADCs are proportionally underestimated along SI, while overestimated along RL compared to true values. Qualitative agreement between our modeled and measured bias (FIG. 4) confirms that gradient non-linearity is the major source of the error.

Some useful outcomes regarding efficient reduction of residual ADC error were realized by our comprehensive gradient nonlinearity model and error analysis: (1) for highly anisotropic media, OVP gradients provide more efficient ADC correction; and (2) minimal effort correction procedure that ignores spatial dependence of off-diagonal cross-terms of nonlinearity tensor can be applied for low anisotropy tissue with LAB-gradients. In practice, the described correction can be implemented via three general implementation Types: (1) providing corrected b-maps (LUT, normalized by b-value) for a set of gradient directions; (2) providing corrected ADC maps; and (3) providing corrected DWI images. When diffusion coefficient for $k^{th}$ direction ($D_{kk}$) is obtained from fitting several ln R measurements at different b-values, spatial bias correction should be applied first, followed by appropriate model fit procedure for ln R($^cb_{kk}$) dependence (e.g., linear, quadratic or arbitrary distribution).

To conclude, spatial dependence of effective (diagonal) b-terms accounts for the bulk (70-90%) of ADC non-uniformity error for anisotropic medium (FA=0.9-0.3) and >97% for isotropic medium. Residual error depends on FA of the medium and the DWI-gradient direction/mode. ADC non-uniformity errors are amplified for anisotropic diffusion and gradient over-plus mode and can be corrected most efficiently. Simplified b-correction algorithm, including spatial dependence of diagonal b-terms rotated into diffusion gradient frame, is found to be sufficient to control conventional (i.e., three-direction) ADC measurement error in clinical studies. This procedure, although applied to ADC measurement, is mathematically robust to experimental noise since it avoids solution of the full eigenvector/eigenvalue problem. Once calculated for specific coil system and gradient direction, the spatial dependence of correction terms is fixed, independent of subject or imaging sequence, and their maps simply scale with b-value. Vendor cooperation may be used to implement viable instrumental correction procedures to control spatial ADC bias errors on clinical scanners.

Figure 5:
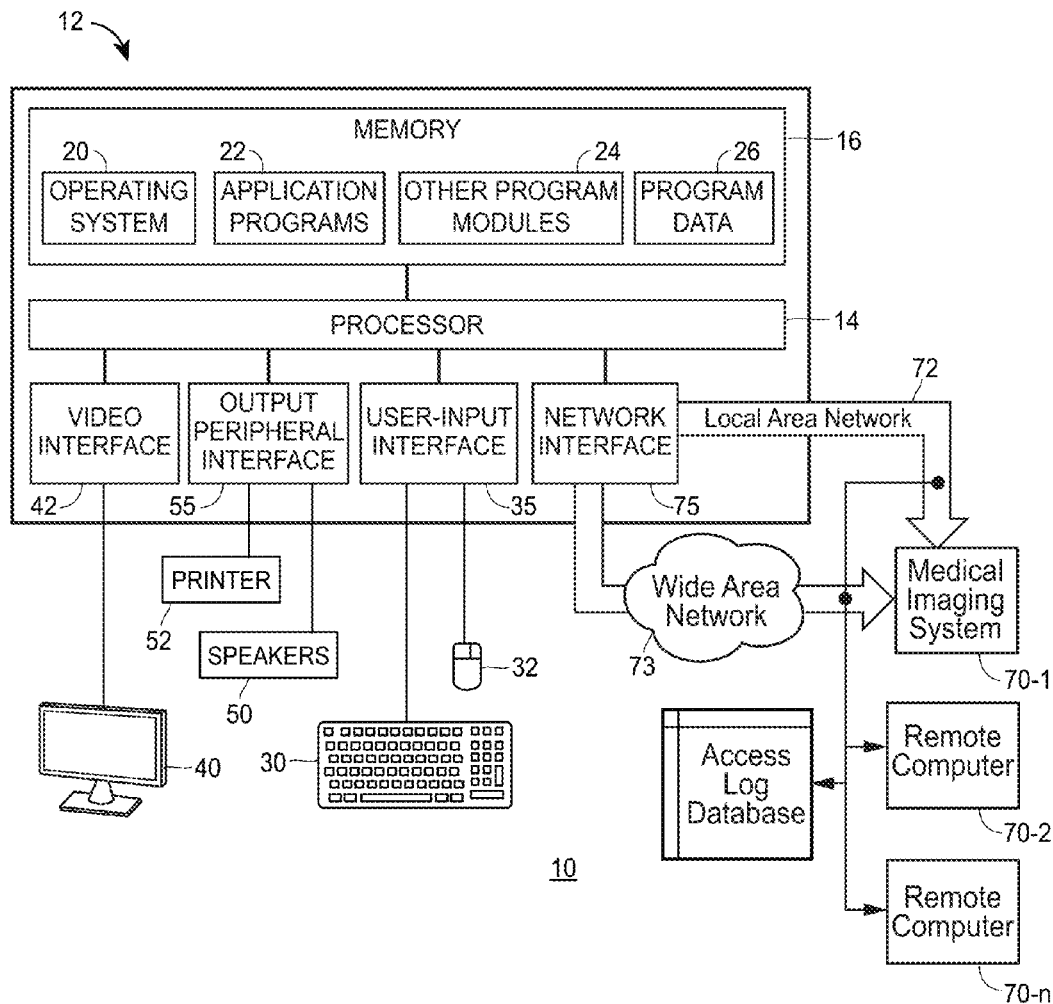
FIG. 5 illustrates an example computer system that may be used for analysis as described here and connected to a medical imaging system.
Figure 6:
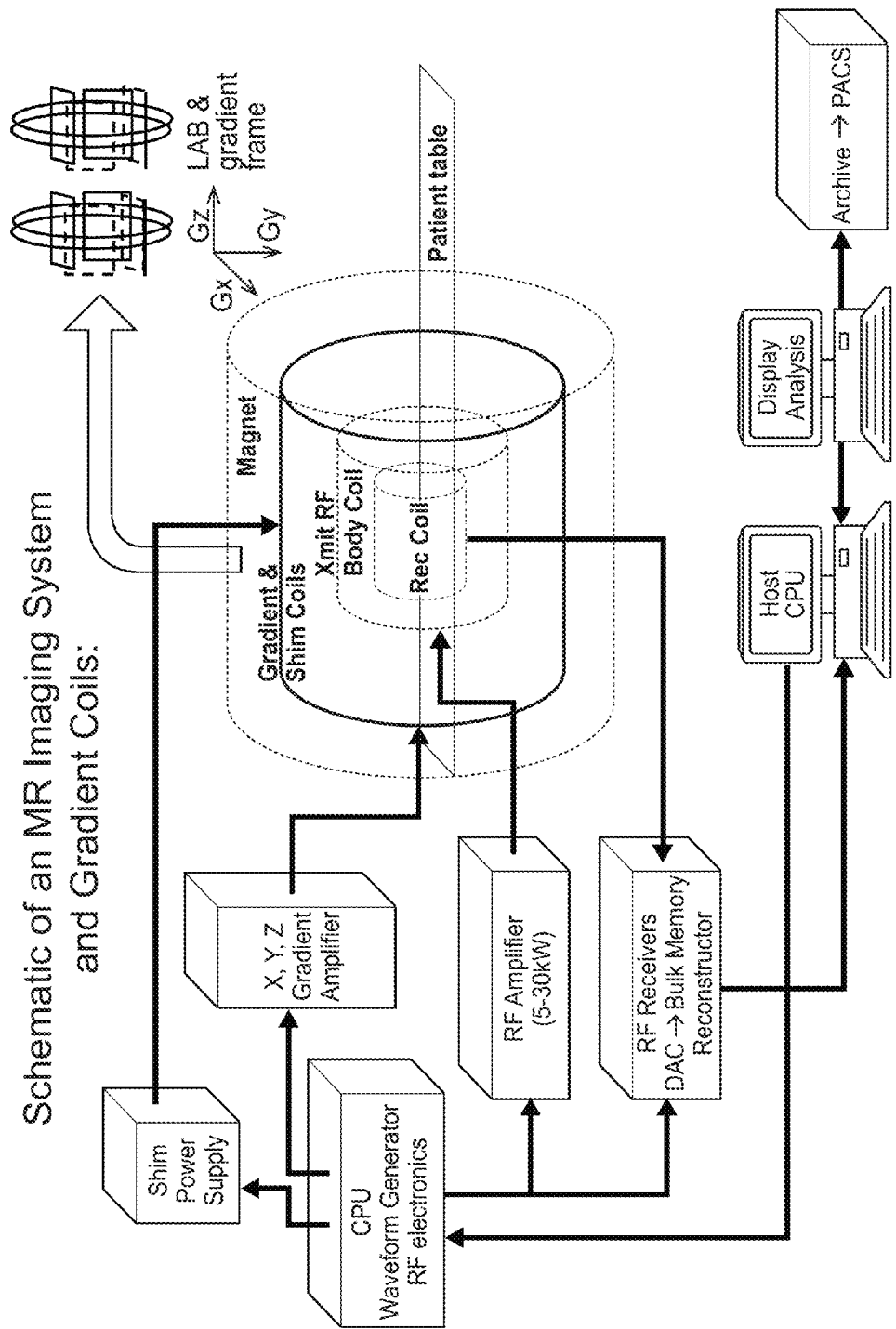
FIG. 6 illustrates an example medical imaging system as may be implemented with the example of FIG. 5.
Figure 7:
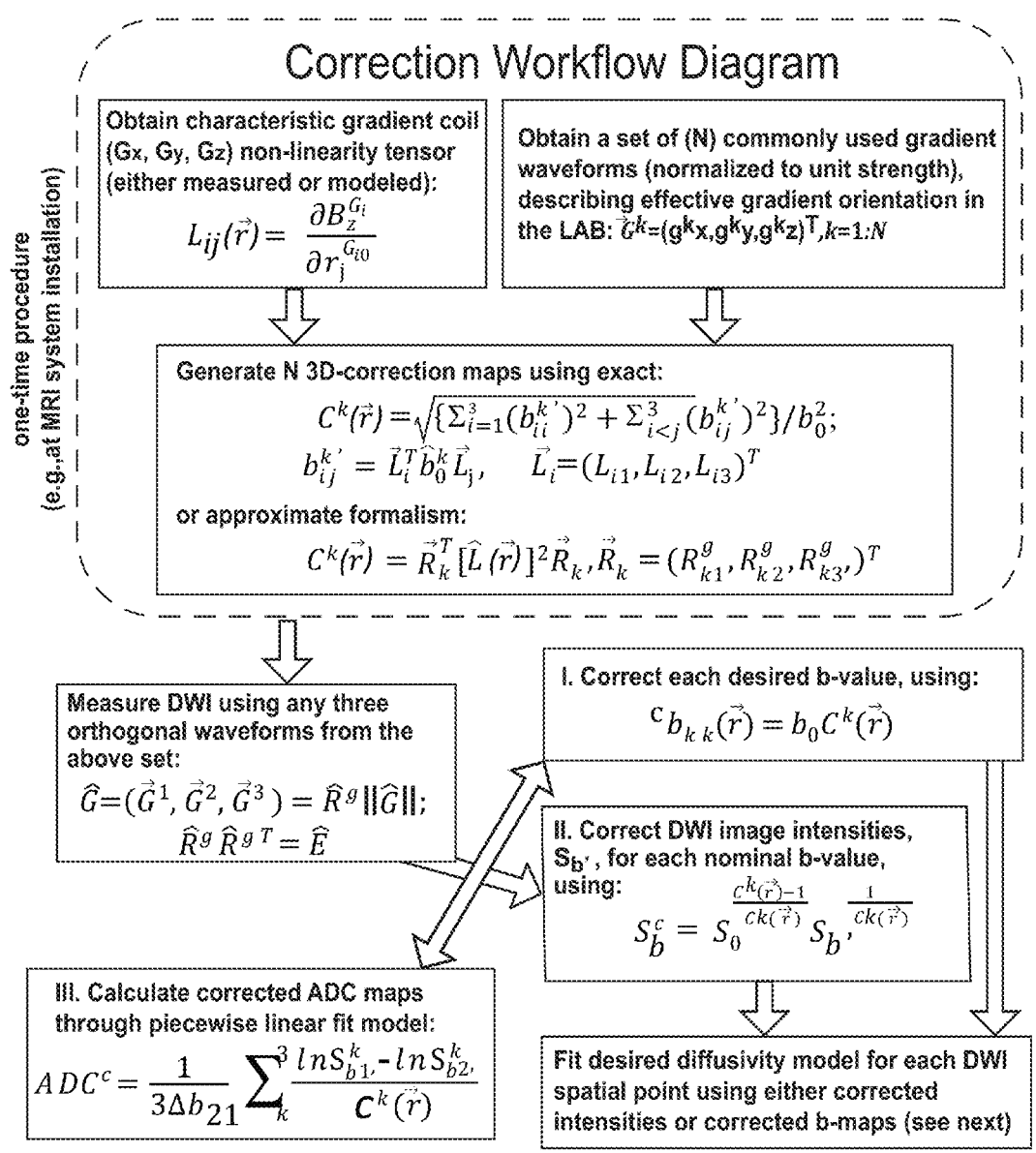
FIG. 7 illustrates an example correction workflow in accordance with examples described herein and as may be implemented in the systems in FIGS. 5 and 6.
Figure 8:
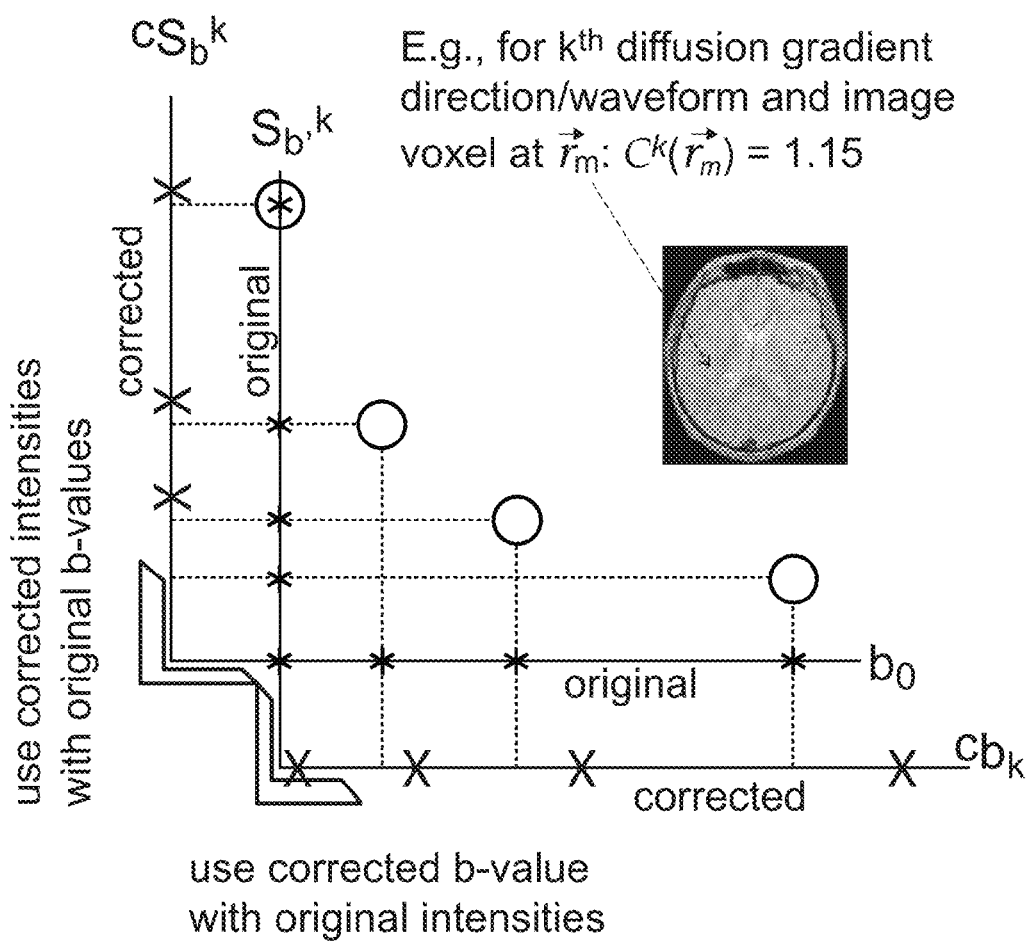
FIG. 8 illustrates an schematic example of a correction implementation as may result from the workflow of FIG. 7.

FIG. 7 illustrates an example correction workflow in accordance with examples described herein and as may be implemented in the systems in FIGS. 5 and 6. FIG. 8 illustrates a schematic example of a correction implementation under Type I or II, as discussed herein and resulting from the workflow of FIG. 7.

With reference to FIG. 5, an exemplary system for implementing the blocks of the method and apparatus includes a general-purpose computing device in the form of a computer 12. Components of computer 12 may include, but are not limited to, a processing unit 14 and a system memory 16. The computer 12 may operate in a networked environment using logical connections to one or more remote computers, such as remote computers 70-1, 70-2, . . . 70-n, via a local area network (LAN) 72 and/or a wide area network (WAN) 73 via a modem or other network interface 75. These remote computers 70 may include other computers like computer 12, but in some examples, these remote computers 70 include one or more of (i) a medical imaging system for producing diffusion images, such as magnetic resonance imaging (MRI) device, (ii) a signal records database systems, (iii) a scanner, and/or (v) a signal filtering system.

In the illustrated example, the computer 12 is connected to a medical imaging system 70-1. The medical imaging system 70-1 may be a stand-alone system capable of performing imaging of a diffusion process of molecules, such as water, in biological tissue for in vivo examination. The system 70-1 may have resolution of such biological features as fibers, membranes, micromolecules, etc., wherein the diffusion image data can reveal microscopic details about biological tissue architecture, in a normal state or diseased state, for example through diffusion tensor imaging (DTI).

Computer 12 typically includes a variety of computer readable media that may be any available media that may be accessed by computer 12 and includes both volatile and nonvolatile media, removable and non-removable media. The system memory 16 includes computer storage media in the form of volatile and/or nonvolatile memory such as read only memory (ROM) and random access memory (RAM). The ROM may include a basic input/output system (BIOS). RAM typically contains data and/or program modules that include operating system 20, application programs 22, other program modules 24, and program data 26. The computer 12 may also include other removable/non-removable, volatile/ nonvolatile computer storage media such as a hard disk drive, a magnetic disk drive that reads from or writes to a magnetic disk, and an optical disk drive that reads from or writes to an optical disk.

A user may enter commands and information into the computer 12 through input devices such as a keyboard 30 and pointing device 32, commonly referred to as a mouse, trackball or touch pad. Other input devices (not illustrated) may include a microphone, joystick, game pad, satellite dish, scanner, or the like. These and other input devices are often connected to the processing unit 14 through a user input interface 35 that is coupled to a system bus, but may be connected by other interface and bus structures, such as a parallel port, game port or a universal serial bus (USB). A monitor 40 or other type of display device may also be connected to the processor 14 via an interface, such as a video interface 42. In addition to the monitor, computers may also include other peripheral output devices such as speakers 50 and printer 52, which may be connected through an output peripheral interface 55.

FIG. 6 illustrates an example implementation of the medical imaging system 70-1 of FIG. 5 and the computer 12. The system 70-1 is illustrated as formed of a host computer 100 and the remaining schematic of an magnetic resonance imaging system 102 and gradient coil assembly 104, as shown. While the computer 12 may be part of this host computer or part of a display analysis computer, as shown. The later is coupled to an archival database 106, e.g., a Picture Archiving and Communication System (PACS). Generally, the techniques herein may be coded any computing language for execution on computer 12, e.g., the display analysis computer in FIG. 6. Diffusion image data may be obtained from the remote computer 70-1, e.g., host computer in FIG. 6, and stored loaded on to any of the computer storage devices of computer 12. Once the diffusion image data is obtained, a user may input or select the condition parameters through an input mechanism as described. Although, in other examples, the condition parameters may be pre-selected or automatically determined, for example, based on a particular type of analysis that is to be performed. The output of the executable program may be displayed on a display (e.g., a monitor 40) of the display computer 12, sent to a printer 52, stored for later use by the computer 12, or offloaded to another system, such as one of the remote computers 70 or the PACS database 106. The output may be in the form of an image (e.g., FIGS. 2a and 2b), a graph (e.g., FIGS. 4a and 4b), a table or any combination thereof, by way of example. Operations of the system may be recorded in a log database for future reference as shown. This log database may be accessed at subsequent times. In any event, the analysis and correction of mean diffusivity data described herein is implemented on the computer 12, in the illustrated examples.

In the illustrated example, the host computer 102 is shown in communication with and in some examples in control of various modules of the MRI system 102. An RF Receivers DAC module 108 provides digital to analog conversion of received RF signals, for example from the gradient coil imager, as well as the original RF waveguide characteristics from module 110. The module 110 may generate an RF waveform that is used for controlling MRI scanning. An RF amplifier module 112 and gradient amplifier module 114 are coupled to receive the RF waveform from module 110 before applying to the gradient coil assembly 104. FIG. 6 illustrates an example orientation of three orthogonal gradient waveforms, which may be normalized to unite strength, in some examples. The orthogonal gradient waveform set is identified to the computer 12 for analysis in accordance with the examples described herein.

The waveform generator 110 is also coupled to a power supply 116 for the MRI system 102, including that of the gradient coils 104.

More generally, the various blocks, operations, and techniques described above may be implemented in hardware, firmware, software, or any combination of hardware, firmware, and/or software. When implemented in hardware, some or all of the blocks, operations, techniques, etc. may be implemented in, for example, a custom integrated circuit (IC), an application specific integrated circuit (ASIC), a field programmable logic array (FPGA), a programmable logic array (PLA), etc.

When implemented in software, the software may be stored in any computer readable memory such as on a magnetic disk, an optical disk, or other storage medium, in a RAM or ROM or flash memory of a computer, processor, hard disk drive, optical disk drive, tape drive, etc. Likewise, the software may be delivered to a user or a system via any known or desired delivery method including, for example, on a computer readable disk or other transportable computer storage mechanism or via communication media. Communication media typically embodies computer readable instructions, data structures, program modules or other data in a modulated data signal such as a carrier wave or other transport mechanism. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency, infrared and other wireless media. Thus, the software may be delivered to a user or a system via a communication channel such as a telephone line, a DSL line, a cable television line, a wireless communication channel, the Internet, etc. (which are viewed as being the same as or interchangeable with providing such software via a transportable storage medium).

FIG. 7 illustrates an example process for correcting for non-linearity in operation of the MRI system 102 of FIG. 6 in accordance with the techniques described herein. Initially, gradient coil tensors are obtained, at a block 202, for the particular MRI system. These tensors, as described herein are non-linear tensors have often plagued by error. Also obtained are a set of commonly used gradient waveforms, such as RF waveforms, that are commonly applied to the gradient coils of the MRI system. These waveforms, obtained by block 204, may be stored on the on the host computer 70-1 in FIG. 6, for example. In other examples, these waveforms may be stored on the computer 12. In either case, these waveforms may be recorded from previous corrections, e.g., corrections of similar MRI systems. The gradient waveforms may be any arbitrary set of orthogonal waveforms, where no more than three such waveforms are needed.

The data from blocks 202 and 204 are provided to a block 206 that generates a three-dimensional (3D) correction map for the MRI system 102 based on the received data, and in accordance with the techniques described herein.

Diffusion weighted image (DWI) MRI scan is then performed on a sample medium using any three orthogonal gradient waveforms, such as the three from the block 204. With the DWI images collected, any of the three different correction types may be applied as illustrated from blocks 210-214. The blocks 210-214 are each capable of determining corrections of the DWI images, where at least for blocks 212 and 214 a further block 216 is shown for fitting a desired diffusivity module for each DWI spatial point of the images, using either the corrected b-maps or corrected intensities, respectively.

FIG. 8 illustrates an example schematic of correction implementations Types I and II. An example, Type I b-value correction is shown along the x-axis for points of a sample region of an MRI image. An example, Type II intensity correction is shown along the y-axis for points of the sample region.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

Thus, although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed:

1. A method of correcting diffusivity measurements of a medium of arbitrary anisotropy, the method comprising;
   (a.). generating three-dimensional spatial correction maps for an arbitrary set of no more than three orthogonal diffusion gradient waveforms using gradient coil non-linearity characteristics of a magnetic resonance imaging (MRI) scanner,
   (b.). performing a diffusion weighted MRI scan of the medium using the selected arbitrary set of no more than three orthogonal diffusion gradient waveform at any nominal b-value, and acquiring diffusion weighted images (DWIs),
   (c.). applying the three-dimensional spatial correction maps to correct intensity of each pixel of the acquired DWIs to compensate for MRI scanner-specific gradient non-linearity bias in diffusion weighting gradients, and
   (d.). determining corrected diffusivity images for a mean diffusivity of the medium from the corrected DWIs and nominal b-values.

2. The method of claim 1, wherein the corrected diffusivity images are determined from uncorrected DWIs using corrected three-dimensional b-value maps.

3. The method of claim 2, wherein the corrected three-dimensional b-value map for the nominal b-value=$b_o$ and $k^{th}$ diffusion gradient direction is determined as, $$^c b_{kk}(\vec{r}) = b_0 c^k(\vec{r}).$$

4. The method of claim 1, where the mean diffusivity is the apparent diffusion coefficient (ADC).

5. The method of claim 1, further comprising applying the three-dimensional spatial correction maps to correct intensity of each pixel of the acquired DWIs over a nominal b-value range.

6. The method of claim 5, wherein the range of nominal b-values includes a single b=0 condition, $S_o$, and three orthogonal diffusion gradient directions at nominal $b_o>0$ to yield corrected mean diffusivity according to a monoexponential model, $$\frac{1}{z b_o} \sum_k^3 \frac{ln S_o - ln S_{b'}^k}{c^k(\vec{r})}.$$

7. The method of claim 1, wherein the three-dimensional spatial correction map for a given diffusion imaging gradient waveform is the highest eigenvalue of spatially-dependent b'-matrix which is equal to its Euclidian norm calculated by, $$C^k(\vec{r}) = \sqrt{\{\Sigma_{i=1}^3 (b_{ii}^k{}')^2 + \Sigma_{i<j}^3 (b_{ij}^k{}')^2\}/b_0^2},$$

where spatial dependence of ij-element of b-matrix for $k^{th}$ DWI direction is described by: $b_{ij}'^k = \vec{L}_i^T \hat{b}_0^k \vec{L}_j$, where $\vec{L}_i = (L_{1i}, L_{2i}, L_{3i})^T$ is the $i^{th}$ column of gradient nonlinearity tensor $\hat{L}(\vec{r})$ obtained as the first spatial derivative of gradient coil fields for a given MRI scanner system.

8. The method of claim 7, wherein an approximation to the three-dimensional spatial correction map for a given $k^{th}$ diffusion imaging gradient waveform is obtained by rotation of the nonlinearity tensor into a DWI frame defined by the three orthogonal diffusion gradient waveforms, $$C^k(\vec{r}) = \hat{L}^g(\vec{r})\hat{L}^{gT}(\vec{r}), \text{ where } \hat{L}^g(\vec{r}) = \vec{R}_k^T \hat{L}(\vec{r})\vec{R}_k$$

where $\vec{R}_k = (R_{xk}{}^g, R_{yk}{}^g, R_{zk}{}^g)^T$ is a unit vector in direction of the $k^{th}=1$ or 2 or 3 mutually orthogonal DWI waveforms.

9. The method of claim 1, wherein the three-dimensional spatial correction maps are independent of nominal b-value over a range of a nominal b-value range.

10. The method of claim 1, wherein (c) comprises correcting the intensity of each pixel of the acquired DWIs using, $$S_b^c = S_0^{\frac{c^k(\vec{r})-1}{c^k(\vec{r})}} S_{b'}^{\frac{1}{c^k(\vec{r})}},$$

where $S_0$ is the unweighted (i.e. b=0) image and $S_{b'}$ is the acquired uncorrected diffusion-weighted image.

11. The method of claim 1 wherein the medium is isotropic and the arbitrary set of no more than three orthogonal diffusion gradient waveforms comprises a single arbitrary diffusion gradient direction.

12. The method of claim 1, wherein determining corrected diffusivity images for the medium from the corrected DWIs reduces a spatially-dependent deviation for mean diffusivity for the medium by between 70%-90% as a percentage of original bias error for the medium, where the medium has a fractional anisotropy of 0.9 to 0.3, respectively.

13. The method of claim 1, wherein determining the corrected diffusivity images for the medium from the corrected DWIs removes a spatially-dependent bias for the medium, wherein the medium is isotropic (FA=0).

14. The method of claim 1, wherein the corrected diffusivity images for the medium are determined from the corrected DWIs and applying any desired model of diffusion signal evolution as a function of b-value.

15. A method of correcting diffusivity measurements of a medium of arbitrary anisotropy, the diffusivity measurements taken by a magnetic resonance scanning system, the method comprising:
obtaining a set of diffusion imaging gradient waveforms, wherein the set of diffusion imaging gradient waveforms describe orientations of diffusion weighted image (DWI) gradients as three-coordinate vectors in a gradient coil frame of reference;
performing a diffusion weighted scan of the medium, using the scanning system and any three orthogonal diffusion imaging gradient waveforms, to obtain a diffusion weighted magnetic resonance image set of the medium;
obtaining a spatial correction map for diffusion weighting of each of the any three diffusion imaging gradient waveforms; and
applying the spatial correction maps to the diffusion weighted magnetic resonance image set to correct for spatially-dependent bias errors in diffusion weighting by correcting the intensity of each pixel in the diffusion weighted magnetic resonance image set.

16. The method of claim 15, wherein the spatially-dependent bias errors comprise gradient nonlinearity error and cross term error.

17. The method of claim 15, wherein applying the spatial correction maps to the diffusion weighted magnetic resonance image set reduces the spatially-dependent bias errors in the diffusion weighted magnetic resonance image set.

18. A non-transitory computer-readable storage medium having stored thereon a set of instructions, executable by a processor, for correcting diffusivity measurements of a medium of arbitrary anisotropy taken by a magnetic resonance scanning system, the instructions comprising:
a) instructions for obtaining a set of diffusion imaging gradient waveforms, wherein the set of diffusion imaging gradient waveforms describe orientations of diffusion weighted image (DWI) gradients as three-coordinate vectors in a gradient coil frame of reference;
b) instructions for performing a diffusion weighted scan of the medium, using the scanning system and any three orthogonal diffusion imaging gradient waveforms, to obtain a diffusion weighted magnetic resonance image set of the medium;
c) instructions for obtaining a spatial correction map for each of the any three diffusion imaging gradient waveforms; and
d) instructions for applying the spatial correction maps to the diffusion weighted magnetic resonance image set to correct for spatially-dependent bias errors in image intensities induced by the incorrect diffusion weighting of the magnetic resonance image set.

19. The non-transitory computer-readable storage medium of claim 18, wherein the spatially-dependent bias errors comprise gradient nonlinearity error and cross term error.

20. The non-transitory computer-readable storage medium of claim 18, wherein the instructions for applying the spatial correction maps to the diffusion weighted magnetic resonance image set includes instructions for reducing the spatially-dependent bias errors in the diffusion weighted magnetic resonance image set.

21. A non-transitory computer-readable storage medium having stored thereon a set of instructions, executable by a processor, for correcting diffusivity measurements of a medium of arbitrary anisotropy, the instructions comprising:
instructions for generating three-dimensional spatial correction maps for an arbitrary set of no more than three orthogonal diffusion gradient waveforms using gradient coil non-linearity characteristics of a magnetic resonance imaging (MRI) scanner;
instructions for performing a diffusion weighted MRI scan of the medium using the selected arbitrary set of no more than three orthogonal diffusion gradient waveform at any nominal b-value, and acquiring diffusion weighted images (DWIs);
instructions for applying the three-dimensional spatial correction maps to correct intensity of each pixel of the acquired DWIs to compensate for MRI scanner-specific gradient non-linearity bias in diffusion weighting; and
instructions for determining corrected diffusivity images for a mean diffusivity of the medium from the corrected DWIs and nominal b-values.

22. The non-transitory computer-readable storage medium of claim 21, wherein the corrected diffusivity images are determined from uncorrected DWIs using corrected three-dimensional b-value maps.

23. The non-transitory computer-readable storage medium of claim 21, wherein the mean diffusivity is the apparent diffusion coefficient (ADC).

24. The non-transitory computer-readable storage medium of claim 23, further comprising applying the three-dimensional spatial correction maps to correct intensity of each pixel of the acquired DWIs over a nominal b-value range.

25. The non-transitory computer-readable storage medium of claim 21, wherein the three-dimensional spatial correction map for a given diffusion imaging gradient waveform is the highest eigenvalue of spatially-dependent b-matrix.

26. The non-transitory computer-readable storage medium of claim 21, wherein the three-dimensional spatial correction maps are independent of nominal b-value over a range of a nominal b-value range.

27. The non-transitory computer-readable storage medium of claim 21, wherein the medium is isotropic and the arbitrary set of no more than three orthogonal diffusion gradient waveforms comprises a single arbitrary diffusion gradient direction.

28. The non-transitory computer-readable storage medium of claim 21, wherein the instructions for determining corrected diffusivity images for the medium from the corrected DWIs reduce a spatially-dependent deviation for mean diffusivity for the medium by between 70%-90% as a percentage of original bias error for the medium, where the medium has a fractional anisotropy of 0.9 to 0.3, respectively.

29. The non-transitory computer-readable storage medium of claim 21, wherein the instructions for determining the corrected diffusivity images for the medium from the corrected DWIs include instructions to remove a spatially-dependent bias for the medium, wherein the medium is isotropic (FA=0).

30. The non-transitory computer-readable storage medium of claim 21, wherein the corrected diffusivity images for the medium are determined from the corrected DWIs and applying any desired model of diffusion signal evolution as a function of b-value.

* * * * *

UNITED STATES PATENT AND TRADEMARK OFFICE
CERTIFICATE OF CORRECTION

PATENT NO.        : 9,851,426 B2
APPLICATION NO.   : 14/398533
DATED             : December 26, 2017
INVENTOR(S)       : Thomas L. Chenevert et al.

Page 1 of 1

It is certified that error appears in the above-identified patent and that said Letters Patent is hereby corrected as shown below:

In the Claims

At Column 20, Line 10, "comprising;" should be -- comprising: --.

Signed and Sealed this
Seventeenth Day of July, 2018

Andrei Iancu
*Director of the United States Patent and Trademark Office*